United States Patent
Uesugi et al.

(10) Patent No.: US 9,300,292 B2
(45) Date of Patent: Mar. 29, 2016

(54) CIRCUIT INCLUDING TRANSISTOR

(71) Applicant: Semiconductor Energy Laboratory Co., Ltd., Atsugi-shi, Kanagawa-ken (JP)

(72) Inventors: Wataru Uesugi, Kanagawa (JP); Yukio Maehashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/591,274

(22) Filed: Jan. 7, 2015

(65) Prior Publication Data

US 2015/0200668 A1    Jul. 16, 2015

(30) Foreign Application Priority Data

Jan. 10, 2014 (JP) .................................. 2014-003017

(51) Int. Cl.
| | |
|---|---|
| H03K 19/00 | (2006.01) |
| H03K 19/0185 | (2006.01) |
| H03K 19/094 | (2006.01) |
| H01L 29/786 | (2006.01) |
| H01L 27/06 | (2006.01) |

(52) U.S. Cl.
CPC ........ *H03K 19/0013* (2013.01); *H01L 27/0688* (2013.01); *H01L 29/7869* (2013.01); *H03K 19/01855* (2013.01)

(58) Field of Classification Search
None
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Jany Richardson
(74) *Attorney, Agent, or Firm* — Fish & Richardson P.C.

(57) ABSTRACT

The power consumption of a semiconductor device that can function as a latch circuit or the like is reduced. The semiconductor device includes a first circuit and a switch that controls conduction between an input terminal and the first circuit. The first circuit includes n second circuits (n is an integer of 2 or more) and a variable resistor. An output node of any of the n second circuits is electrically connected to an input node of the second circuit in a first stage through the variable resistor. The variable resistor can be, for example, a transistor whose channel is formed in an oxide semiconductor layer. A reduction in the number of elements or signals leads to a reduction of the power consumption of the semiconductor device.

24 Claims, 16 Drawing Sheets

(56) References Cited

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,362,538 B2 | 1/2013 | Koyama et al. |
| 8,717,806 B2 | 5/2014 | Kurokawa |
| 8,787,073 B2 | 7/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063287 A1 | 3/2007 | Sano et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0042218 A1 | 2/2008 | Igarashi et al. |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0121878 A1 | 5/2011 | Kato et al. |
| 2011/0134683 A1 | 6/2011 | Yamazaki et al. |
| 2011/0175646 A1 | 7/2011 | Takemura et al. |
| 2011/0176357 A1 | 7/2011 | Koyama et al. |
| 2011/0194332 A1 | 8/2011 | Saito |
| 2012/0056175 A1 | 3/2012 | Takemura |
| 2013/0049806 A1* | 2/2013 | Koyama .......................... 326/68 |
| 2013/0141157 A1 | 6/2013 | Takemura |
| 2014/0266367 A1 | 9/2014 | Uesugi |
| 2015/0061742 A1 | 3/2015 | Maehashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 11-176153 A | 7/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-141212 A | 7/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of

(56) References Cited

OTHER PUBLICATIONS

International Electron Devices Meeting, Dec. 5, 2005, pp. 1067-1069.
Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using Cg—Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 :Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Sympsium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.

(56) References Cited

OTHER PUBLICATIONS

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

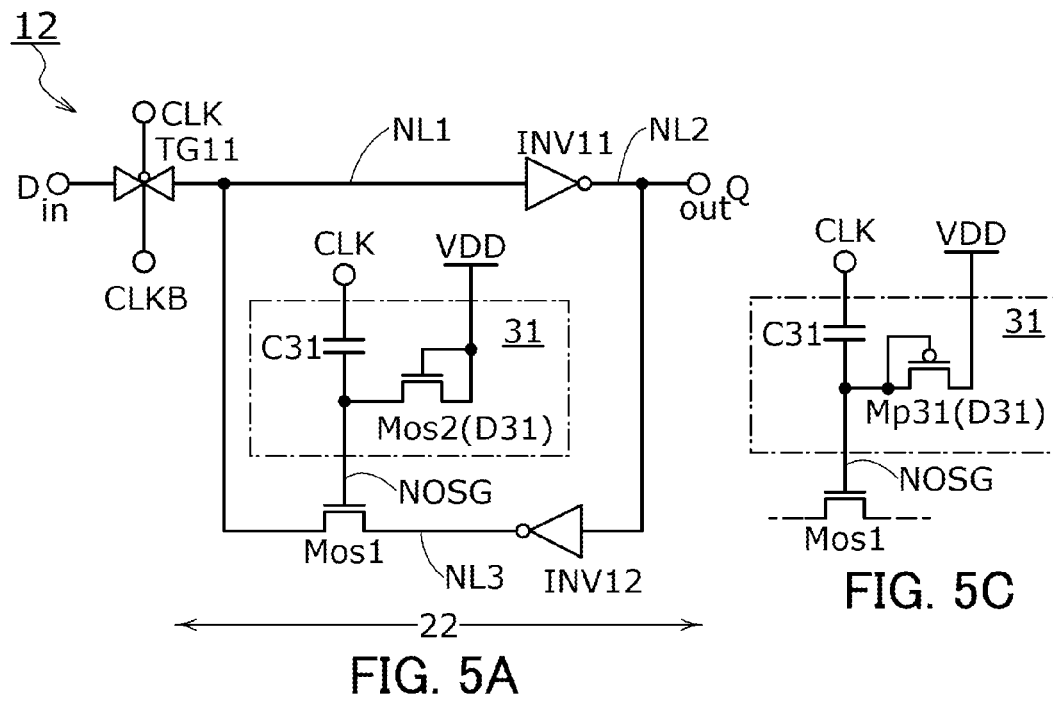
FIG. 5A
FIG. 5C
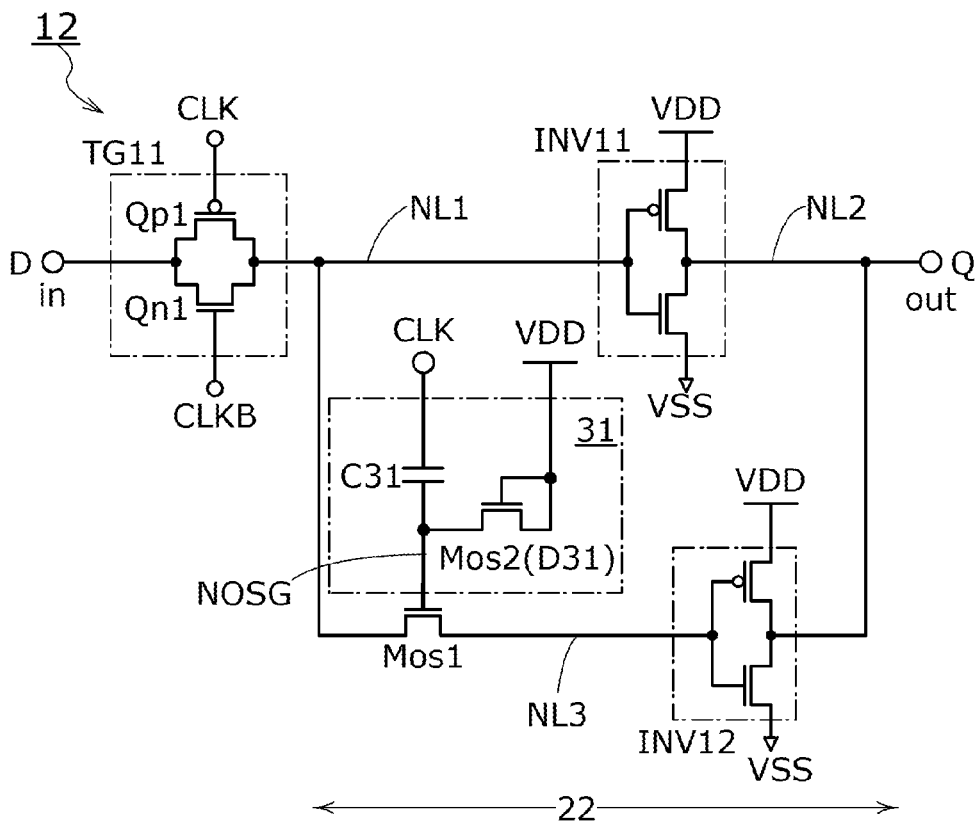
FIG. 5B

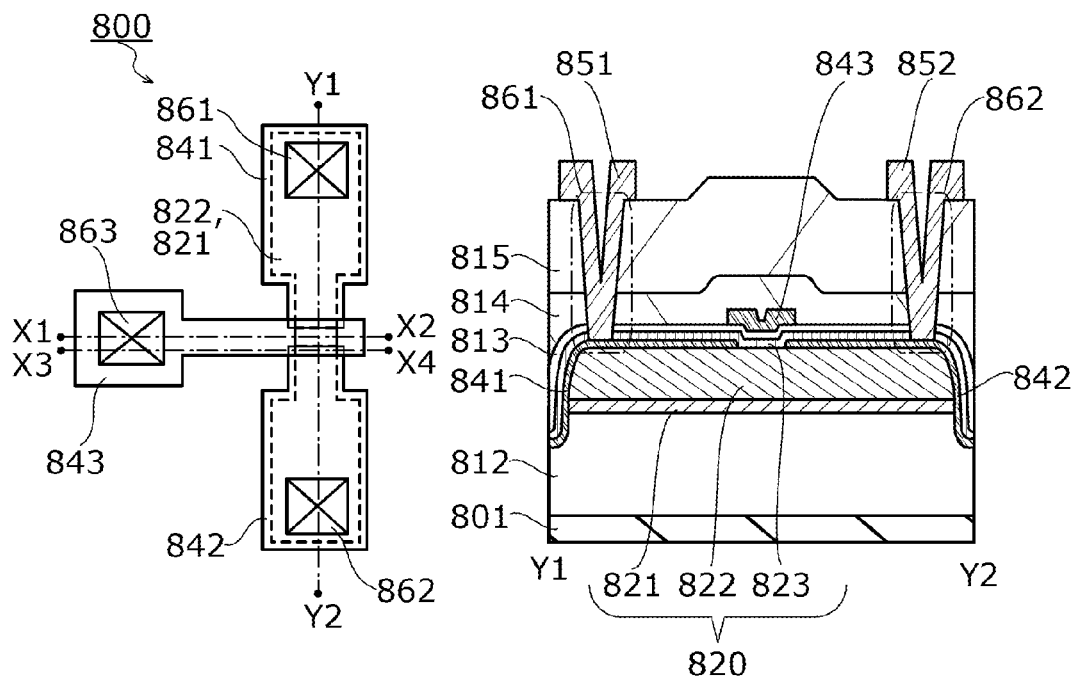
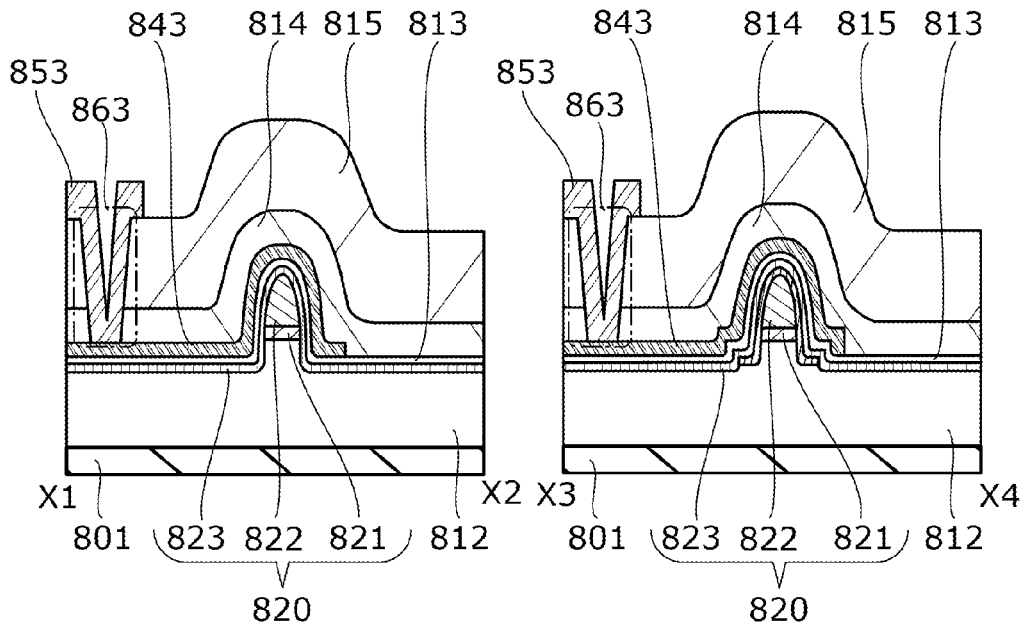

CIRCUIT INCLUDING TRANSISTOR

BACKGROUND OF THE INVENTION

1. Field of the Invention

One embodiment of the present invention relates to a semiconductor device, a method for driving the semiconductor device, a method for manufacturing the semiconductor device, and the like.

Note that the present invention is not limited to the above technical field. The technical field of one embodiment of the invention disclosed in the specification, the drawings, and the claims (hereinafter referred to as "this specification and the like") relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

2. Description of the Related Art

A latch circuit is a kind of sequential circuit and is also a kind of storage circuit capable of storing 1-bit data as "0" or "1."

FIG. 17A is an example of a conventional latch circuit. FIG. 17B is an equivalent circuit diagram of FIG. 17A. As illustrated in FIGS. 17A and 17B, a latch circuit (LAT) 91 includes two transmission gates (92 and 93) and two inverters (94 and 95). The transmission gate 93 and the inverters 94 and 95 form a loop circuit. The phases of clock signals CLK and CLKB are inverted from each other. VDD is a high power supply potential and VSS is a low power supply potential.

In the LAT 91, an output signal of the inverter 94 is output from an output terminal out as a data signal Q. When the clock signal CLK is at a low level, an input terminal of the LAT 91 and an input node of the inverter 94 are brought into conduction, a data signal D is input to the inverter 94, and the output signal of the inverter 94 is output from the LAT 91 as the data signal Q. When the clock signal CLK is set at a high level, the input node of the inverter 94 and the input terminal of the LAT 91 are brought out of conduction, and the input node of the inverter 94 and an output node of the inverter 95 are brought into conduction. While the clock signal CLK is at a high level, the loop circuit formed by the inverters 94 and 95 retains data (state). For example, by connecting two LATs 91, a master-slave flip-flop can be formed.

A transistor in which a channel is formed in a layer of an oxide semiconductor (OS) such as an In—Ga—Zn oxide (In—Ga—Zn—O) (hereinafter such a transistor is referred to as an OS transistor) is known. In addition, it is known that an OS transistor has significantly lower off-state current than a Si transistor because an oxide semiconductor has a wider bandgap than silicon. For example, Patent Document 1 discloses a memory circuit in which an OS transistor is used as a switch.

REFERENCE

Patent Document: Japanese Published Patent Application No. 2013-141212

SUMMARY OF THE INVENTION

The power consumption of a semiconductor device such as a processor needs to be reduced. Owing to scaling and improved integration technology, a large integrated circuit or a microprocessor includes hundreds of millions of transistors. The power consumption of such a semiconductor device is increased because many transistors operate and leakage current (specifically, gate leakage current) of the transistors is increased due to scaling. Consequently, a chip generates heat, which inhibits an increase in operating frequency.

As illustrated in FIGS. 17A and 17B, a latch circuit consumes power every time the potential level of a clock signal is changed. The latch circuit is one of circuits included in a semiconductor device. Since the operating frequency of a recent semiconductor device is high, power consumption is increased. Thus, a reduction in the power consumption of the latch circuit leads to a reduction in the power consumption of a semiconductor device including the latch circuit. Furthermore, a reduction in the area of the latch circuit leads to a reduction in the area of the semiconductor device and a reduction in manufacturing cost.

An object of one embodiment of the present invention is to provide a novel semiconductor device, a novel method for manufacturing the semiconductor device, a novel method for driving the semiconductor device, and the like. For example, an object of one embodiment of the present invention is to provide a semiconductor device with lower power consumption and a method for driving the semiconductor device; a semiconductor device with a smaller number of elements and a method for driving the semiconductor device; a semiconductor device with a smaller area and a method for driving the semiconductor device; or a semiconductor device with lower manufacturing cost and a method for driving the semiconductor device. Another object of one embodiment of the present invention is, for example, to provide a novel semiconductor device including an OS transistor and a method for driving the semiconductor device.

Note that the description of a plurality of objects does not disturb the existence of each object. One embodiment of the present invention does not necessarily achieve all the objects described above. Other objects will be apparent from and can be derived from the description of this specification and the like, and such objects could be objects of one embodiment of the present invention.

One embodiment of the present invention is a semiconductor device including an input terminal, an output terminal, a first switch, and a first circuit. The first circuit includes first and second nodes. A first signal is capable of controlling conduction of the first switch. The first switch is capable of controlling conduction between the input terminal and the first node. The second node is electrically connected to the output terminal. The first circuit includes a variable resistor and n electrically cascaded second circuits (n is an integer of 2 or more). A second signal is capable of controlling the resistance of the variable resistor. The first node is an input node of the second circuit in a first stage. The second node is an output node of any of the n second circuits. The output node of the second circuit in an n-th stage is electrically connected to the input node of the second circuit in the first stage through the variable resistor.

In the above embodiment, the variable resistor is a first transistor whose channel is formed in an oxide semiconductor layer, and the second signal is input to a gate of the first transistor. For example, the second signal can be a signal whose potential is constant.

Note that in this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit and a chip including an integrated circuit are all semiconductor devices. Moreover, a display device, a light-emitting device, a lighting device, an electronic device, and the like include a semiconductor device in some cases.

One embodiment of the present invention can provide a novel semiconductor device, a novel method for manufacturing the semiconductor device, a novel method for driving the semiconductor device, and the like. For example, one embodiment of the present invention can provide a semiconductor device with lower power consumption, a method for driving the semiconductor device, a method for manufacturing the semiconductor device, and the like. Furthermore, one embodiment of the present invention can provide a semiconductor device with a smaller number of elements or signals, a method for driving the semiconductor device, a method for manufacturing the semiconductor device, and the like.

Note that the description of these effects does not disturb the existence of other effects. In one embodiment of the present invention, there is no need to obtain all the effects described above. In one embodiment of the present invention, other objects, effects, and novel features will be apparent from and can be derived from the description of the specification and the drawings.

BRIEF DESCRIPTION OF THE DRAWINGS

In the accompanying drawings:

FIGS. 5A and 5C are circuit diagrams each illustrating a circuit structure example, and FIG. 5B is an equivalent circuit diagram of FIG. 5A;

FIGS. 15A to 15D illustrate a device structure example of an OS transistor;

DETAILED DESCRIPTION OF THE INVENTION

Figure 1A:
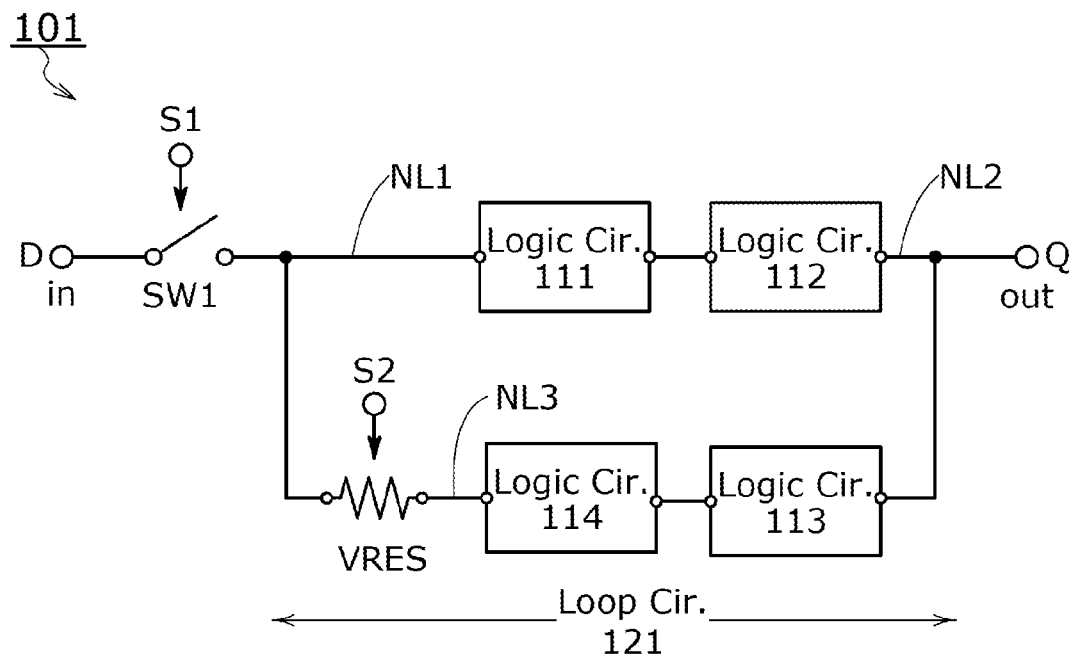
FIGS. 1A and 1B are block diagrams each illustrating a circuit structure example.

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that an explicit description "X and Y are connected" indicates the case where X and Y are electrically connected, the case where X and Y are functionally connected, and the case where X and Y are directly connected. Here, each of X and Y denotes an object (e.g., a device, an element, a circuit, a wiring, an electrode, a terminal, a conductive film, or a layer). Accordingly, a connection relationship other than those shown in drawings and texts is also included without limitation to a predetermined connection relationship, for example, the connection relationship shown in the drawings and the texts.

Note that the term "electrical connection" includes a circuit structure in which current, voltage, or a potential can be supplied or transmitted. Accordingly, the expression "two components are connected" means not only a circuit structure in which the two components are directly connected but also a circuit structure in which the two components are electrically connected through an element such as a wiring, a resistor, a diode, or a transistor so that current, voltage, or a potential can be supplied or transmitted.

Even when independent components are connected in a circuit diagram, there is the case where one conductive film has functions of a plurality of components, such as the case where part of a wiring functions as an electrode. The term "connection" in this specification also means such a case where one conductive film has functions of a plurality of components.

Note that voltage refers to a difference between potentials of two points, and a potential refers to electrostatic energy (electric potential energy) of a unit electric charge at a given point in an electrostatic field. In general, a difference between a potential of one point and a reference potential (e.g., a ground potential) is merely called a potential or voltage, and a potential and voltage are used as synonyms in many cases. Thus, in this specification and the like, a potential may be rephrased as voltage and voltage may be rephrased as a potential unless otherwise specified.

Note that a transistor is an element having three terminals: a gate, a source, and a drain. Depending on the channel type of the transistor or levels of potentials applied to the terminals, one of two terminals (source and drain) functions as a source and the other of the two terminals functions as a drain. In general, in an n-channel transistor, a terminal to which a low potential is applied is referred to as a source, and a terminal to which a high potential is applied is referred to as a drain. In contrast, in a p-channel transistor, a terminal to which a low potential is applied is referred to as a drain, and a terminal to which a high potential is applied is referred to as a source.

In the following description, to clarify a circuit structure and circuit operation, one of two terminals of a transistor is fixed as a source and the other of the two terminals is fixed as a drain in some cases. In an n-channel transistor, a terminal (electrode) to which a high-level (H-level) signal and a high power supply potential are mainly input is referred to as a drain, and a terminal (electrode) to which a low-level (L-level) signal and a low power supply potential are mainly input is referred to as a source. In a p-channel transistor, a terminal (electrode) to which a high-level (H-level) signal and a high power supply potential are mainly input is referred to as a source, and a terminal (electrode) to which a low-level (L-level) signal and a low power supply potential are mainly input is referred to as a drain. It is needless to say that, depending on a driving method, the magnitude relationship between voltages applied to the terminals of the transistor might be changed, and the source and the drain might be interchanged. Thus, in one embodiment of the present invention, the distinction between the source and drain of the transistor is not limited to that described in this specification and the like.

In one embodiment of the present invention, a variety of switches can be used as a switch. The switch is conducting or not conducting (is turned on or off) to determine whether current flows. Alternatively, the switch has a function of determining and changing a current path. For example, the switch has a function of determining whether current can flow through a path 1 or a path 2 and switching the paths. Examples of the switch include an electrical switch and a mechanical switch. That is, any element can be used as a switch as long as it can control current, without limitation to a certain element. Examples of the switch include a transistor (e.g., a bipolar transistor or a metal-oxide-semiconductor (MOS) transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined. An example of a mechanical switch is a switch formed using a micro electro mechanical system (MEMS) technology, such as a digital micromirror device (DMD). The switch includes an electrode that can be moved mechanically, and operates to control conduction and non-conduction with the movement of the electrode.

In one embodiment of the present invention, there is no particular limitation on the device structure of a capacitor intentionally provided as an element. For example, either a MIM capacitor or a MOS capacitor can be used.

In this specification, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°.

In this specification, trigonal and rhombohedral crystal systems are included in a hexagonal crystal system.

In this specification, the same portions or portions having similar functions in the drawings used for the description of embodiments of the present invention are denoted by the same reference numerals, and the description thereof is not repeated in some cases.

In this specification, the clock signal CLK is abbreviated to "a signal CLK," "CLK," or the like in some cases. The same applies to other signals, voltages, potentials, circuits, elements, and the like.

A plurality of embodiments of the present invention are described below, and any of the embodiments can be combined as appropriate. In addition, in the case where some structure examples are described in one embodiment, any of the structure examples can be combined as appropriate.

Embodiment 1

In this embodiment, circuits capable of storing 1-bit data are described as semiconductor device examples.

FIG. 1A illustrates a structure example of such a circuit. A circuit 101 includes a switch SW1, a variable resistor VRES, a logic circuit 111, a logic circuit 112, a logic circuit 113, and a logic circuit 114. A 1-bit data signal D is input to the circuit 101, and the circuit 101 has a function of retaining a data signal Q ("0" or "1") that corresponds to the data signal D and a function of outputting the data signal Q. The circuit 101 can function as, for example, a memory circuit for storing output data of a combinational circuit.

The logic circuits 111 to 114 are cascaded. An input node of the logic circuit 111 in the first stage is connected to an output node of the logic circuit 114 in the final stage through VRES, and the logic circuits 111 to 114 and VRES form a loop circuit 121. The loop circuit 121 can function as a data retention portion of the circuit 101.

A node NL1 is an input node of the loop circuit 121 and corresponds to the input node of the logic circuit 111 in the first stage in FIG. 1A. A node NL2 is an output node of the loop circuit 121 and corresponds to an output node of the logic circuit 112 in FIG. 1A. The node NL2 can be an output node of any of the logic circuits 111 to 114 included in the loop circuit 121. The node NL2 is connected to an output terminal out of the circuit 101, and the potential of the node NL2 is output from the circuit 101 as the data signal Q. A node NL3 corresponds to the output node of the logic circuit 114 in the final stage.

The switch SW1 is provided between an input terminal in of the circuit 101 and the node NL1 and has a function of controlling conduction between the input terminal in of the circuit 101 and the node NL1. In other words, the switch SW1 has a function of controlling conduction between the input terminal in of the circuit 101 and the input node of the loop circuit 121. Conduction of SW1 is controlled by a signal S1. When SW1 is turned on, the data signal D is input from the terminal in to the logic circuit 111. When SW1 is turned off, the input terminal in and the loop circuit 121 are brought out of conduction.

The resistance of VRES is changed by a signal S2. While SW1 is on, the data signal D is input from the terminal in to the node NL1; thus, the resistance of VRES is controlled to avoid a collision between an output of the logic circuit 114 and the data signal D at the node NL1. While SW1 is off, the loop circuit 121 retains data that corresponds to the data signal D. The resistance of VRES is controlled so that output data of the logic circuit 111 is fed back to the input node of the logic circuit 111.

In the circuit 101, the potential of NL1 is rewritten in accordance with the potential of the data signal D in response to the signal S1. When SW1 is turned on, the internal state of the circuit 101 is updated. The data signal D input from the input terminal in is sequentially transferred to the nodes NL1 and NL2, and the data signal Q is output from the output terminal out. While SW1 is off, data written to the node NL1 is input to the node NL1 again through the nodes NL2 and NL3 and VRES. The resistance of VRES is controlled so that the data written to the node NL1 is fed back to the node NL1 as described above.

In some cases, instead of one signal, a plurality of signals are used as the signal S1 that controls SW1. Similarly, instead of one signal, a plurality of signals are used as the signal S2 that controls the resistance of VRES. Examples of the signals used as S1 and S2 include signals whose potential levels are constant. The same applies to signals other than S1 and S2.

Although FIG. 1A illustrates the circuit structure example in which the loop circuit 121 includes four logic circuits (111 to 114), the loop circuit 121 should include at least two logic circuits. The loop circuit 121 should include at least one logic circuit between NL1 and NL2 (data transfer path) and include at least one logic circuit between NL2 and NL3 (feedback loop). In addition, the loop circuit 121 can include one or more logic circuits between the terminal in and SW1, between SW1 and NL1, or between NL2 and the terminal out, for example.

Examples of the logic circuits 111 to 114 include logic gate circuits that can perform basic logical operation, such as an AND gate circuit, an OR gate circuit, an inverter (NOT gate circuit), a NAND gate circuit, a NOR gate circuit, an XOR (exclusive OR) gate circuit, an XNOR (exclusive NOR) gate circuit, and a buffer circuit.

Figure 1B:
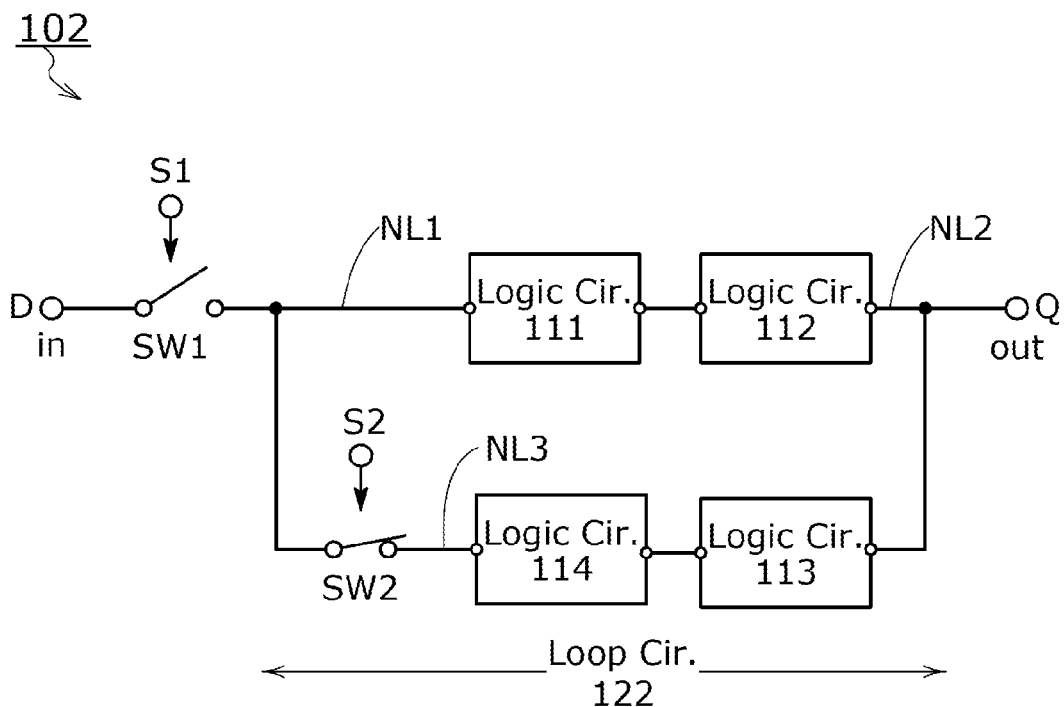

VRES can function as a switch that controls conduction between NL1 and NL3 depending on the signal S2 or an element structure. An example of such a circuit structure is illustrated in FIG. 1B. As illustrated in FIG. 1B, a circuit 102 corresponds to a circuit in which the variable resistor VRES in the circuit 101 is changed into a switch SW2. A loop circuit 122 in the circuit 102 includes the logic circuits 111 to 114 and the switch SW2. Conduction of the switch SW2 is controlled by the signal S2. In FIG. 1B, for example, the signals S1 and S2 can be input to the circuit 102 so that the conduction of SW1 and the conduction of SW2 are complementary.

Each of the circuits 101 and 102 can operate as a memory circuit that retains 1-bit data. For example, each of the circuits 101 and 102 can be used as a latch circuit, a memory cell of a static random access memory (SRAM), or a flip-flop circuit. Specific structure examples of the circuits 101 and 102 and examples of methods for driving the circuits 101 and 102 are described below with reference to drawings. In Structure Examples 1 to 4, two inverters are provided in a loop circuit as a plurality of logic circuits.

Structure Example 1

Figure 2A:
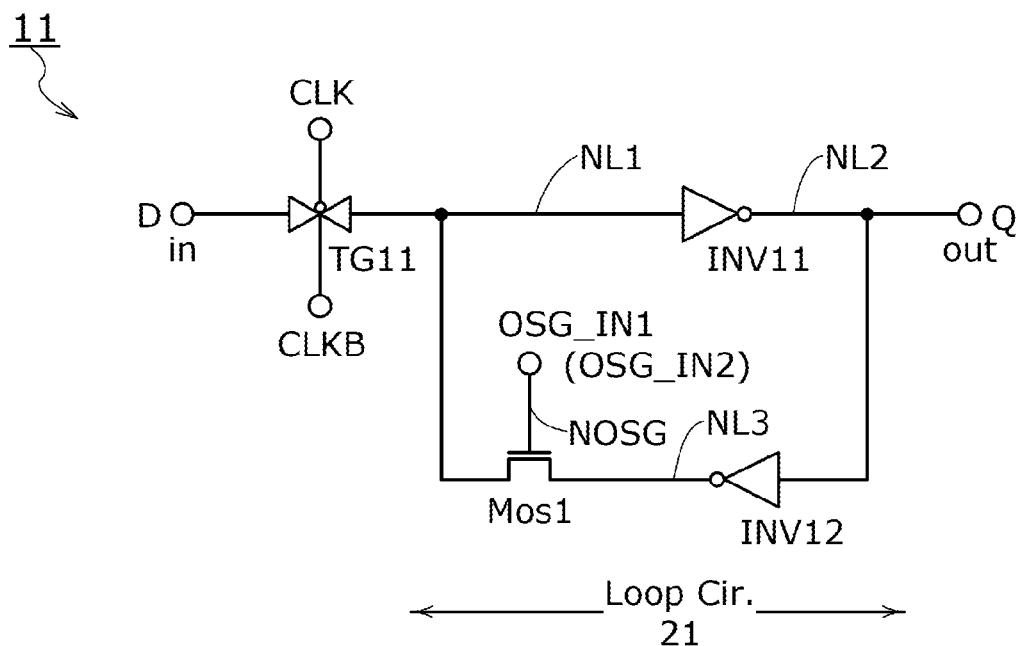
FIG. 2A is a circuit diagram illustrating a circuit structure example.
Figure 2B:
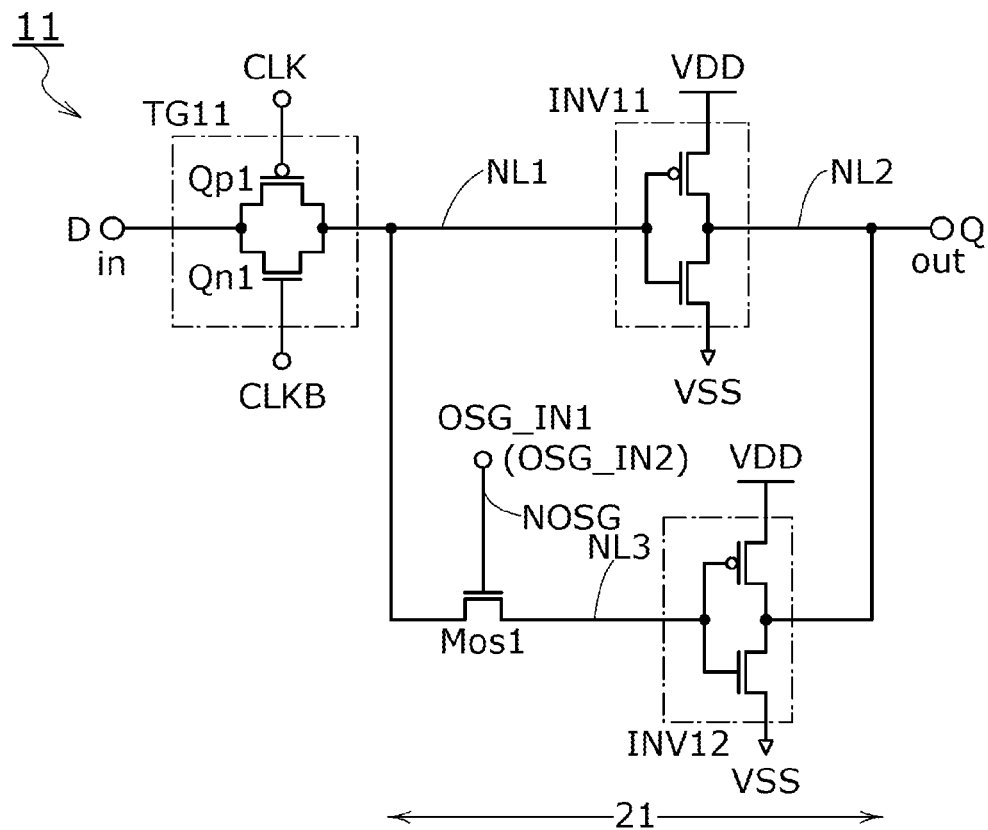
FIG. 2B is an equivalent circuit diagram of FIG. 2A.

FIG. 2A is a circuit diagram illustrating a circuit structure example, and FIG. 2B is an equivalent circuit diagram of FIG. 2A. Note that even when an element is represented by a circuit symbol of one transistor in the circuit diagram, the element might be formed by connecting a plurality of transistors in parallel and/or in series in an actual circuit. The same applies to other elements such as a capacitor and a resistor.

A circuit 11 in FIG. 2A can operate as a memory circuit having a function of retaining 1-bit data. As illustrated in FIG. 2A, the circuit 11 includes a transmission gate TG11, a transistor Mos1, and inverters INV11 and INV12. A loop circuit 21 functions as a data retention portion of the circuit 11 and includes Mos1, INV11, and INV12. In FIG. 2A, the node NL1 corresponds to an input node of the inverter INV11. The node NL2 corresponds to an output node of INV11 and an input node of INV12. The node NL3 corresponds to an output node of INV12.

The potentials VDD and VSS are power supply potentials for driving the circuit 11 and used as power supply potentials for driving INV11 and INV12 in FIG. 2B. For example, a ground potential (GND) or a potential of 0 V can be supplied to the circuit 11 as VSS.

Although INV11 and INV12 are each formed using a CMOS inverter in FIG. 2B, one embodiment of the present invention is not limited thereto. For example, a transistor that serves as a load can be formed using a resistor, a diode, a diode-connected transistor, or a depletion transistor.

The transmission gate TG11 is a circuit (element) that corresponds to SW1 in the circuit 101, and can function as a switch that controls conduction between the input terminal in of the circuit 11 and the node NL1. In other words, TG11 can function as a switch that controls conduction between the input terminal in and the loop circuit 21.

TG11 is controlled by the clock signals CLK and CLKB. CLK and CLKB are signals whose phases are inverted from each other. For example, as illustrated in FIG. 2B, TG11 can include transistors Qn1 and Qp1 connected in parallel. When CLK is at a high level, Qn1 and Qp1 are turned off; thus, TG11 is brought out of conduction. When CLK is at a low level, Qn1 and Qp1 are turned on; thus, TG11 is brought into conduction.

The transistor Mos1 is an element that corresponds to VRES in the circuit 101 and can function as a three-terminal variable resistor. One of a source and a drain of the transistor Mos1 is connected to the node NL3, and the other of the source and the drain of the transistor Mos1 is connected to the node NL1. The value of source-drain current of the transistor Mos1 is changed by a signal OSG_IN1 input to a gate (node NOSG) of the transistor Mos1; thus, the transistor Mos1 can function as a variable resistor.

The transistor Mos1 can be a transistor whose channel is formed using a semiconductor made of a Group 14 element, such as Si, SiC, or Ge, (e.g., a Si transistor), an OS transistor, or the like.

The OS transistor has extremely high resistance in an off-state (off-state resistance). In other words, the OS transistor has extremely low leakage current in an off-state (off-state current). Extremely low off-state current means that off-state current per micrometer of channel width is lower than or equal to 100 zA. Since the off-state current is preferably as low as possible, the normalized off-state current is preferably lower than or equal to 10 zA/µm or lower than or equal to 1 zA/µm, more preferably lower than or equal to 10 yA/µm. The off-state current of the OS transistor is extremely low because an oxide semiconductor used for a channel has a wider bandgap (higher than or equal to 3.0 eV) than a Group 14 semiconductor such as Si or Ge. Consequently, the OS transistor has low leakage current due to thermal excitation and extremely low off-state current.

By reducing impurities serving as electron donors (donors), such as moisture or hydrogen, and reducing oxygen vacancies, an i-type (intrinsic) or substantially intrinsic oxide semiconductor can be obtained. Here, such an oxide semiconductor is referred to as a highly purified oxide semiconductor. By forming the channel using a highly purified oxide semiconductor, the normalized off-state current of the OS transistor can be as low as several yoctoamperes per micrometer to several zeptoamperes per micrometer.

An oxide semiconductor film of the OS transistor preferably contains at least indium (In) or zinc (Zn). The oxide semiconductor preferably contains an element that functions as a stabilizer for reducing variations in electrical characteristics. Examples of such an element include Ga, Sn, Hf, Al, and Zr. Typical examples of the oxide semiconductor film of the OS transistor include an In—Ga oxide film, an In—Ga—Zn oxide film, and an In—Sn—Zn oxide film. Note that the oxide semiconductor film is described in detail in Embodiment 2.

By using an OS transistor having high off-state resistance as the transistor Mos1, increasing the resistance of the transistor Mos1 sufficiently is facilitated, and a change in the potential of the node NL1 can be reduced while TG11 is conducting. Consequently, the output error of the circuit 11 can be reduced.

There is no particular limitation on the transistors included in TG11, INV11, and INV12, and transistors having device structures similar to those of transistors included in a semiconductor device including the circuit 11 can be used. For example, TG11, INV11, and INV12 can each include a transistor whose channel is formed using a semiconductor made of a Group 14 element, such as Si, SiC, or Ge (e.g., a Si transistor), or an OS transistor. Although the Si transistor has higher off-state current than the OS transistor, the Si transistor has an advantage of higher response speed than the OS transistor; thus, when TG11, INV11, and INV12 each include a Si transistor, the circuit 11 can have high drive frequency.

In addition, when some transistors (e.g., the transistor Mos1) are OS transistors and the other transistors are Si transistors, the area of the circuit 11 can be reduced. This is because as described in Embodiment 2 (FIG. 14), the OS transistors can be stacked over the Si transistors.

Figure 17A:
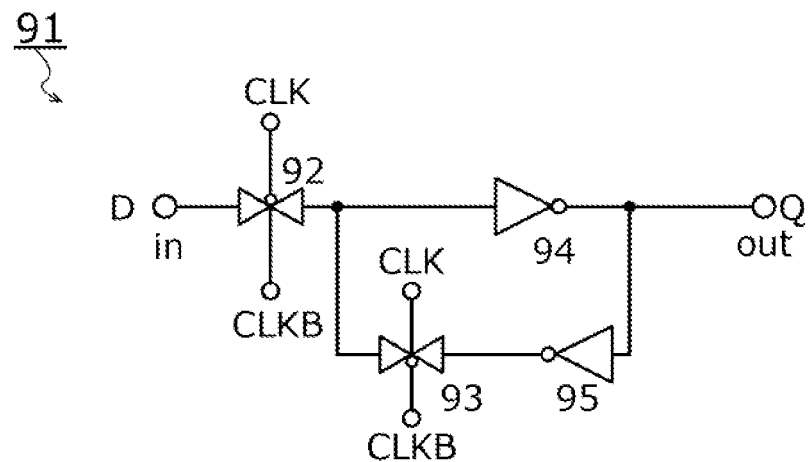
FIG. 17A is a circuit diagram illustrating a structure example of a conventional latch circuit.
Figure 17B:
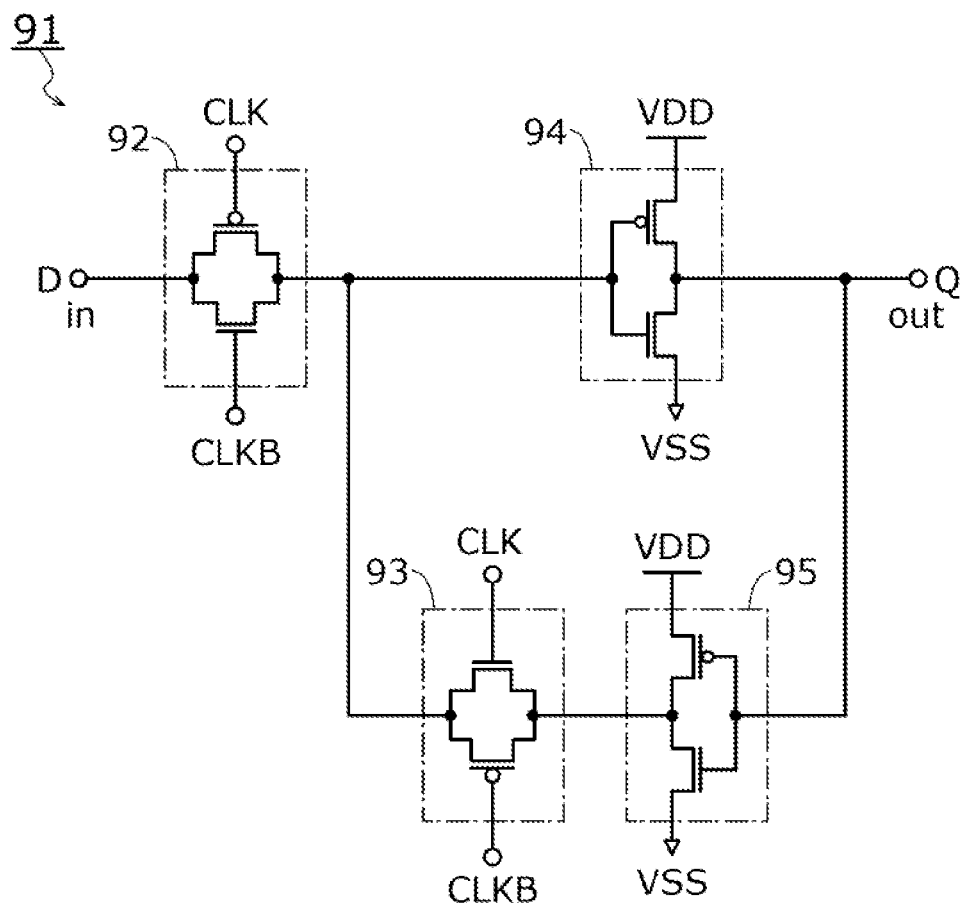
FIG. 17B is an equivalent circuit diagram of FIG. 17A.

As is clear from the circuit diagrams in FIG. 2B and FIG. 17B, the number of transistors in the circuit 11 can be smaller than that in the LAT 91. Thus, the area of the circuit 11 can be reduced. In addition, since the number of transistors in the circuit 11 is small, the dynamic power consumption of the circuit 11 can be reduced.

Example 1 of Driving Method

Example 1-1 of Driving Method

Figure 3A:
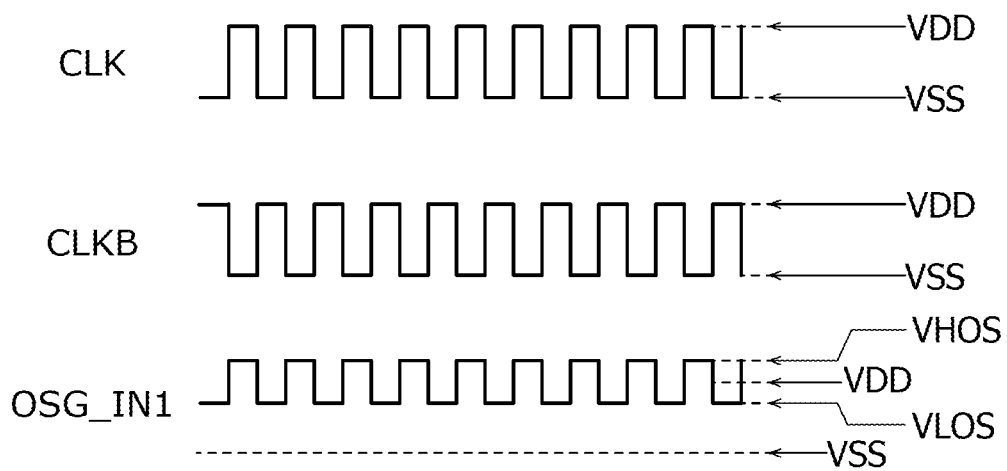
FIGS. 3A and 3B are timing charts each illustrating an example of a method for driving the circuit in FIGS. 2A and 2B.

An example of a method for driving the circuit 11 is described with reference to FIG. 3A. FIG. 3A is a timing chart illustrating an example of the method for driving the circuit 11, which shows waveforms of the signals CLK, CLKB, and OSG_IN1 input to the circuit 11. Note that FIG. 3A shows the waveform of the signal OSG_IN1 when the transistor Mos1 is an n-channel transistor.

CLK and CLKB are clock signals whose high-level potentials are VDD and whose low-level potentials are VSS. CLKB is an inverted signal of CLK. CLKB can be generated when the circuit 11 includes one inverter or odd-numbered inverters connected in series for inverting the phase of the signal CLK.

OSG_IN1 is a signal oscillating at the same cycle as CLK. The high-level potential of OSG_IN1 is a potential VHOS, and the low-level potential of OSG_IN1 is a potential VLOS. In FIG. 3A, VLOS is input to the node NOSG when TG11 is conducting, and VHOS is input to the node NOSG when TG11 is not conducting. In other words, the resistance of the transistor Mos1 is increased when TG11 is conducting, and the resistance of the transistor Mos1 is decreased when TG11 is not conducting.

The threshold voltage of the OS transistor is higher than that of the Si transistor in some cases. Thus, in the case where the transistor Mos1 is an OS transistor, to inhibit a decrease in the potential of the node NL1 due to the threshold voltage (Vth1) of the transistor Mos1 as much as possible while TG11 is not conducting (CLK is at a high level), VHOS is preferably higher than VDD by at least Vth1. In other words, it is preferable to satisfy VHOS≥VDD+Vth1.

Although the low-level potential VLOS of OSG_IN1 can be VSS, lowering the low-level potential VLOS of OSG_IN1 to VSS is not needed. VLOS may be lower than or equal to Vth1. It is possible to satisfy Vth1≥VLOS≥VSS.

Thus, the amplitude (VHOS−VLOS) of OSG_IN1 can be smaller than the amplitude (VDD−VSS) of the clock signal CLK. Accordingly, the dynamic power consumption of the circuit 11 can be lower than that of the circuit 91 (FIGS. 17A and 17B). In addition, unlike FIG. 3A, in the case where the signal waveforms of CLK and CLKB are not ideal signal waveforms or the phases of CLK and CLKB are deviated, for example, a CMOS switch formed using an n-channel transistor and a p-channel transistor causes flow-through current and consumes extra power. In Structure Example 1, not such a CMOS switch but a unipolar transistor (Mos1) that functions as a variable resistor is provided in the loop circuit 21. Consequently, flow-through current does not flow to the variable resistor by input of OSG_IN1, so that the dynamic power consumption of the circuit 11 is reduced.

Example 1-2 of Driving Method

Figure 3B:
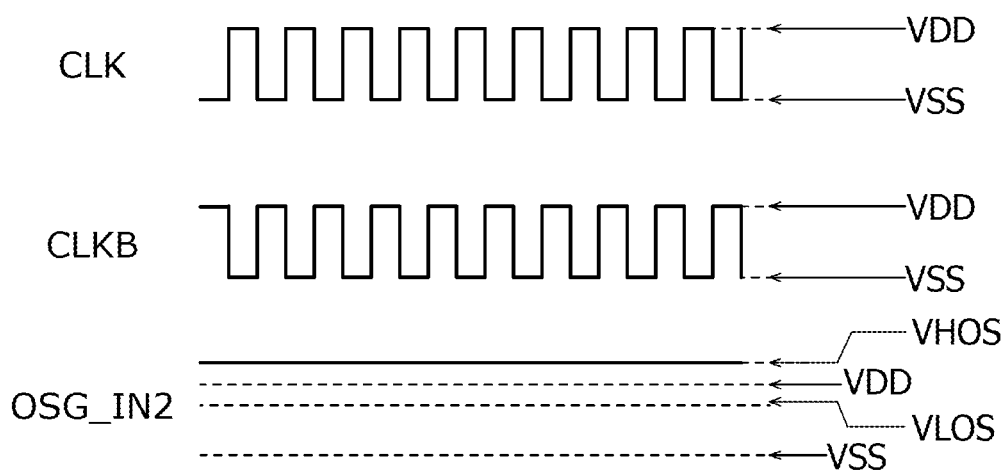

Although FIG. 3A illustrates the example in which OSG_IN1 whose potential is changed at the same cycle as CLK is used as the signal that controls the resistance of the transistor Mos1, a signal having a constant potential can also be used. FIG. 3B illustrates an example of such a signal. FIG. 3B is a timing chart illustrating an example of a method for driving the circuit 11, which shows waveforms of the signals CLK, CLKB, and OSG_IN2 input to the circuit 11. OSG_IN2 is a signal input to the node NOSG, and FIG. 3B shows the waveform of the signal OSG_IN2 when the transistor Mos1 is an n-channel transistor.

While TG11 is conducting (CLK is at a low level), if the resistance (on-state resistance) of the transistor Mos1 is sufficiently high when a potential (VHOS≥VDD+Vth1) is input to the gate of the transistor Mos1, the constant potential VHOS can be used as a signal input to the gate of the transistor Mos1 regardless of oscillation of CLK.

While TG11 is conducting, the data signal D is input to the node NL1 from the input terminal in and an output signal of INV12 is input to the node NL1 through the variable resistor (Mos1). Thus, while TG11 is conducting, in the node NL1, the variable resistor (Mos1) may attenuate the output signal of INV12 so that the data signal D can be output from the output terminal out of the circuit 11 through INV11 as the data signal Q. Accordingly, if the resistance of the transistor Mos1 is high enough to attenuate the output signal of INV12 when VHOS is input to the node NOSG, the signal OSG_IN2 having the constant potential VHOS can be used. When a control signal of the variable resistor (transistor Mos1) has a constant potential, the dynamic power consumption of the circuit 11 can be reduced as compared with the example of the driving method in FIG. 3A.

Structure Example 2

Figure 4:
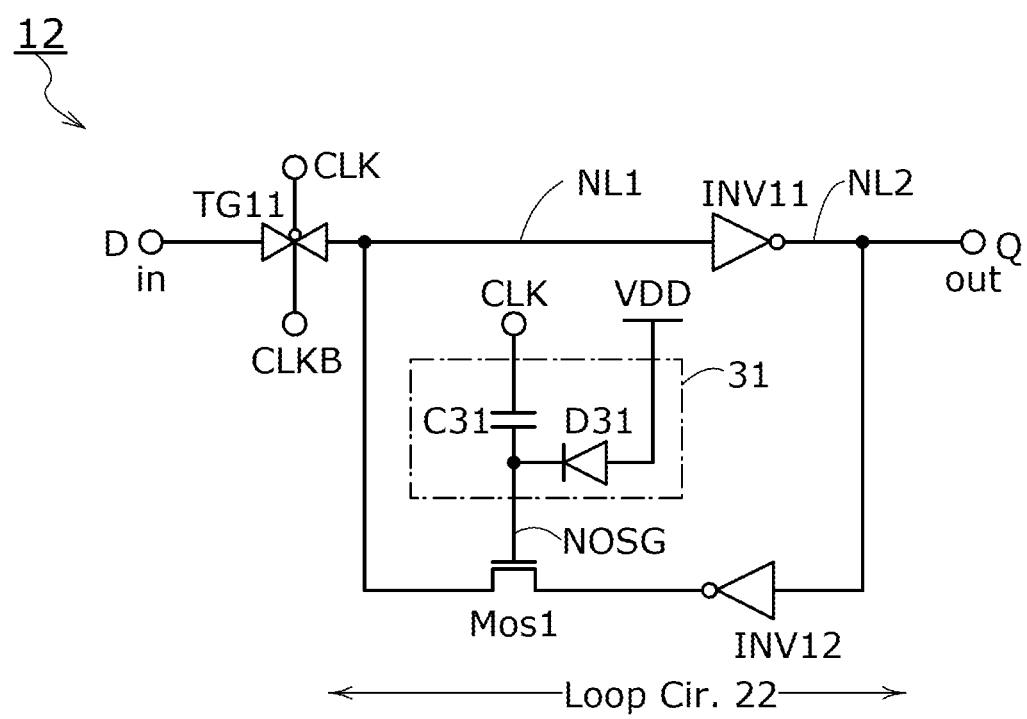
FIG. 4 is a circuit diagram illustrating a circuit structure example.

FIG. 4 is a circuit diagram illustrating a circuit structure example. A circuit 12 in FIG. 4 is a modification example of the circuit 11 and corresponds to a circuit in which a circuit 31 is provided at the node NOSG. A loop circuit 22 in the circuit 12 includes INV11, INV12, the transistor Mos1, and the circuit 31. The circuit 12 can function as a memory circuit that retains 1-bit data like the circuit 11.

The circuit 31 includes a diode D31 and a capacitor C31. The circuit 31 functions as a signal generation circuit that generates signals input to the node NOSG (the gate of the transistor Mos1). Furthermore, the circuit 31 can function as a bootstrap circuit and can function as a step-up circuit (step-up DC-DC converter) that can generate potentials higher than an input potential (VDD).

As illustrated in FIG. 4, one of two terminals (electrodes) of the capacitor C31 is connected to a wiring to which the signal CLK is supplied, and the other of the two terminals of the capacitor C31 is connected to a cathode of the diode D31. The diode D31 is referred to as a bootstrap diode (BSD) in some cases. An anode of the diode D31 is connected to a wiring to which the power supply potential VDD is supplied, and the cathode of the diode D31 is connected to the node NOSG. The circuit 31 has functions of raising the voltage of a signal input from the diode D31 and outputting the signal to the node NOSG. The signal CLK is a control signal that controls bootstrap operation and is input to one of terminals of the circuit 31.

In the circuit 31, the diode D31 can be formed using an element or circuit having a rectification function. For example, as illustrated in FIG. 5A, the circuit 31 can be formed using a diode-connected transistor Mos2 and the capacitor C31. FIG. 5B is an equivalent circuit example of FIG. 5A. In FIG. 5A, the transistor Mos 2 is an n-channel transistor. The transistor Mos2 has a diode-connected structure in which a drain and a gate are connected. The transistor Mos2 connects the wiring to which VDD is supplied to the node NOSG so that forward current flows from the wiring to the node NOSG. Specifically, the drain of the transistor Mos2 is connected to the wiring to which VDD is supplied, and a source of the transistor Mos2 is connected to the node NOSG.

There is no particular limitation on the device structure of the transistor Mos2, as in the transistors Qp1 and Qn1 included in TG11. For example, the transistor Mos2 can be a transistor whose channel is formed using a semiconductor made of a Group 14 element, such as Si, SiC, or Ge (e.g., a Si transistor), or an OS transistor. In the case where the transistor Mos2 is an n-channel transistor, the transistors Mos1 and Mos2 can be OS transistors and the other transistors can be Si transistors. When the circuit 12 has such a device structure, the area overhead of the circuit 12 due to the circuit 31 can be reduced. This is because the area of the circuit 12 can be reduced by stacking OS transistors over Si transistors, as described in Embodiment 3.

The diode D31 can also be formed using a p-channel transistor. FIG. 5C illustrates an example of such a structure. A transistor Mp31 has a diode-connected structure in which a drain and a gate are connected, like the transistor Mos2. The transistor Mp31 connects a wiring to which VDD is supplied to the node NOSG so that forward current flows from the wiring to the node NOSG. Specifically, a source of the transistor Mp31 is connected to the wiring to which VDD is supplied, and the drain of the transistor Mp31 is connected to the node NOSG.

The circuit 31 provided in the circuit 12 enables application of a potential that is higher than VDD to the node NOSG. In other words, the circuit 31 can generate a signal that corresponds to OSG_IN1 (FIG. 3A). Thus, the number of elements in a semiconductor device including the circuit 12 and the power consumption of the semiconductor device can be reduced because a potential generation circuit that generates VHOS and VHOL and a wiring for supplying OSG_IN1 are not needed.

Example 2 of Driving Method

Figure 6:
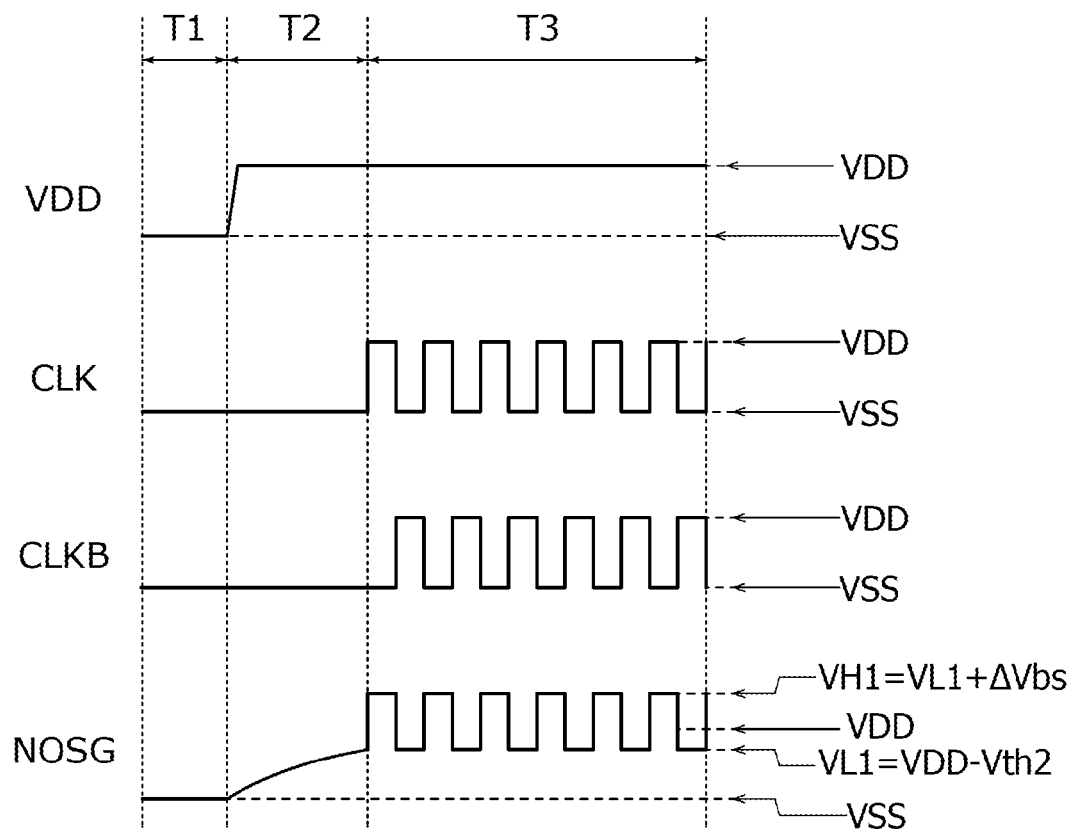
FIG. 6 is a timing chart illustrating an example of a method for driving the circuit in FIGS. 5A to 5C.

An example of a method for driving the circuit 12 is described with reference to FIG. 6. FIG. 6 is a timing chart illustrating an example of a method for driving the circuit 12, which shows waveforms of the signals CLK and CLKB, and changes in the potential of a power supply line for the power supply potential VDD and the potential of the node NOSG. Note that FIG. 6 is a timing chart when the transistors Mos1 and Mos2 are n-channel transistors.

As illustrated in FIG. 6, a low-level potential is supplied to the node NOSG while TG11 is conducting, and a high-level potential is supplied to the node NOSG while TG11 is not conducting.

(Period T1)

In a period T1, the clock signals CLK and CLKB and the power supply line are each at the low-level potential VSS. In the period T1, the supply of CLK, CLKB, and VDD is stopped, the circuit 12 is deactivated, and the supply of power is stopped.

(Period T2)

In a period T2, the input of CLK and CLKB is stopped and the power supply potential VDD is supplied to the power supply line. The circuit 12 is in a standby state. When the supply of VDD is started, electric charge is stored in the capacitor C31 by rectification operation of the transistor Mos2, and the potential of the node NOSG is raised to VL1 (=VDD−Vth2). Vth2 is the threshold voltage of the transistor Mos2.

(Period T3)

A period T3 is a normal operation period of the circuit 12 during which CLK, CLKB, and VDD are supplied. As illustrated in FIG. 6, the circuit 31 outputs a high-level potential VH1 (=VL1+ΔVbs) or the low-level potential VL1 to the node NOSG in accordance with a change in the potential level of CLK input to the capacitor C31. Specifically, while CLK is at a high level, the circuit 31 raises the potential of the node NOSG by the potential ΔVbs that is proportional to the capacitance of the capacitor C31. When the capacitances of the capacitor C31 and the node NOSG (an output node of the circuit 31) are denoted by $Ca_{31}$ and $Cb_{31}$, respectively, ΔVbs is represented by Equation (1). Note that the capacitance of the node NOSG corresponds to the gate capacitance of the transistor Mos1, the parasitic capacitance of the transistor Mos2, and the like. $Ca_{31}$ may be determined so that VH1 is higher than or equal to (VDD+Vth1).

$$\Delta Vbs = VDD \times \frac{Ca_{31}}{Ca_{31} + Cb_{31}} \qquad (1)$$

In the case where the high-level power supply potential VDD is first supplied to the circuit 12, it takes a certain time to raise the potential of the node NOSG to VL1 because storing electric charge in the capacitor C31 is needed. This time can be shortened by using an OS transistor as the transistor Mos2. This is because while CLK and VDD are each at a low level and the node NOSG is electrically floating (in the period T1), leakage of electric charge from the node NOSG can be inhibited due to the extremely low off-state current of the transistor Mos2. Accordingly, even if the circuit 12 is deactivated by stopping the supply of CLK, CLKB, and VDD after the circuit 12 operates normally, a change in the potential of the node NOSG can be inhibited. Consequently, in the case where the supply of CLK and CLKB is started immediately after the supply of VDD is restarted, the circuit 12 can operate normally.

Structure Example 3

Figure 7A:
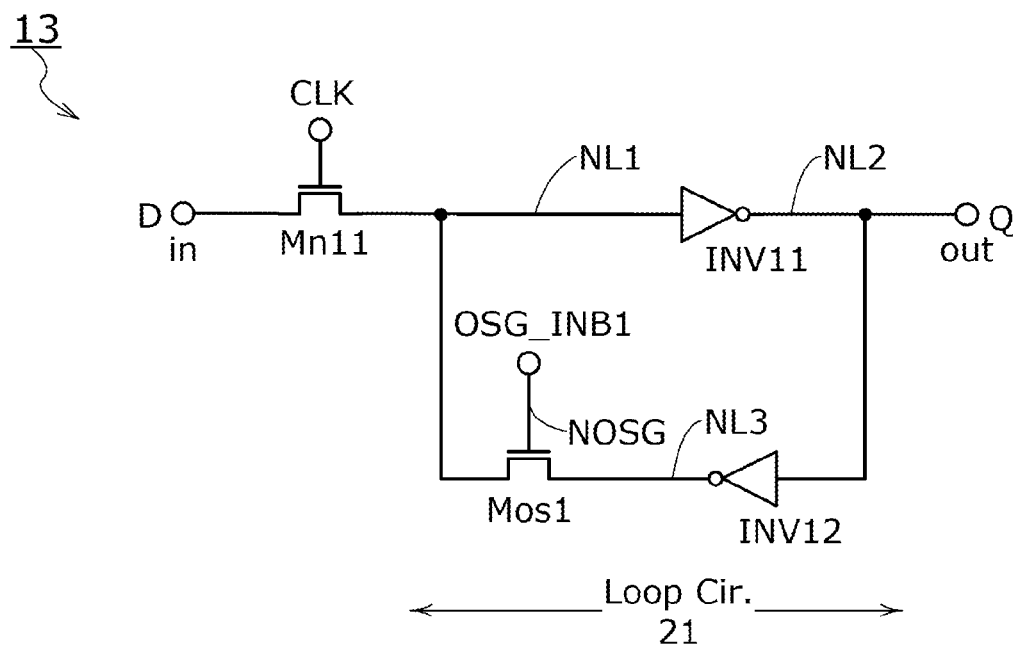
FIG. 7A is a circuit diagram illustrating a circuit structure example.
Figure 7B:
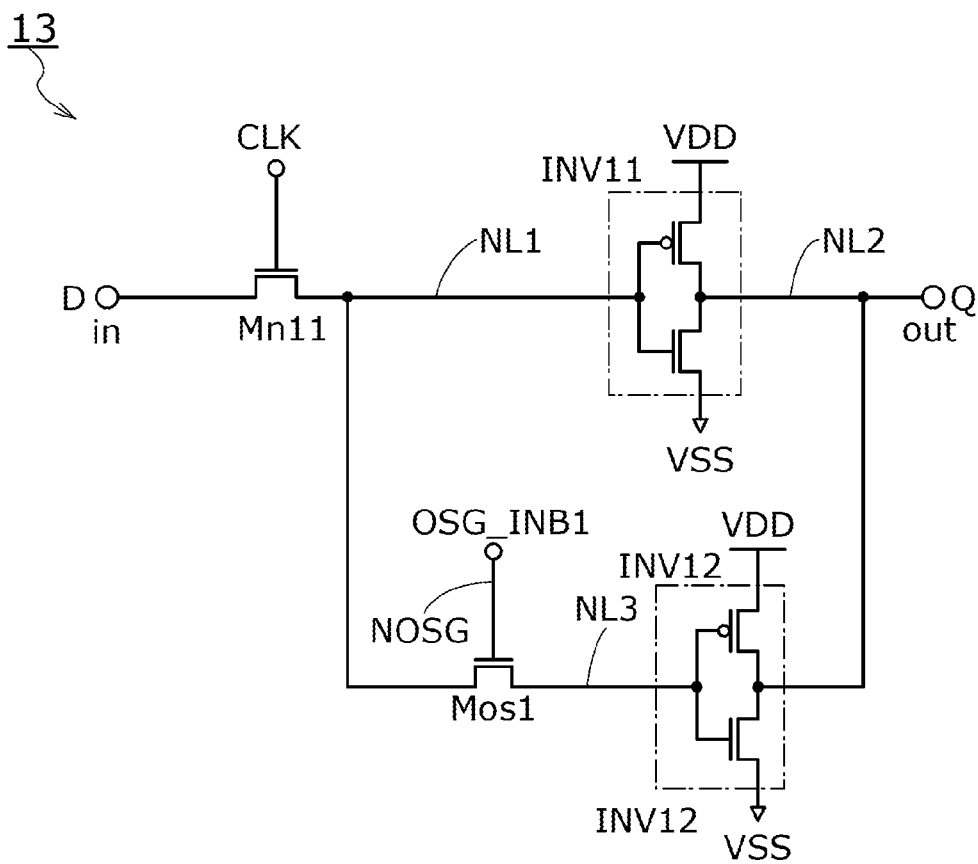
FIG. 7B is an equivalent circuit diagram of FIG. 7A.

FIG. 7A is a circuit diagram illustrating a circuit structure example, and FIG. 7B is an equivalent circuit diagram of FIG. 7A.

A circuit 13 in FIG. 7A can operate as a memory circuit having a function of retaining 1-bit data. The circuit 13 is a modification example of the circuit 11 in which the switch SW1 (FIG. 1A) that controls conduction between the input terminal in and the loop circuit 21 is changed into an n-channel transistor Mn11. When the switch SW1 is formed using a unipolar transistor as in the circuit 13, the circuit 13 can eliminate the inverted signal CLKB of the clock signal CLK. The number of elements and the number of input signals of the circuit 13 are smaller than those of the circuit 11.

In FIG. 7A, an inverted signal OSG_INB1 of the signal OSG_IN1 (FIG. 3A) may be input to the node NOSG. Specifically, the low-level potential VLOS is input to the node NOSG while the transistor Mn11 is on (while CLK is at a high level), and the high-level potential VHOS is input to the node NOSG while the transistor Mn11 is off (while CLK is at a low level). Alternatively, the signal OSG_IN2 having a constant potential (FIG. 3B) can be input to the node NOSG instead of the signal OSG_INB1.

In the circuit 13, the circuit 31 (FIG. 4, FIG. 5A, and FIG. 5B) may be connected to a gate of the transistor Mn11. With such a circuit structure, a potential that is higher than VDD can be applied to the gate of the transistor Mn11. Thus, a decrease in the potential of the node NL1 due to the threshold voltage of the transistor Mn11 can be prevented when the transistor Mn11 is on, so that the operational stability of the circuit 13 is improved.

Figure 8A:
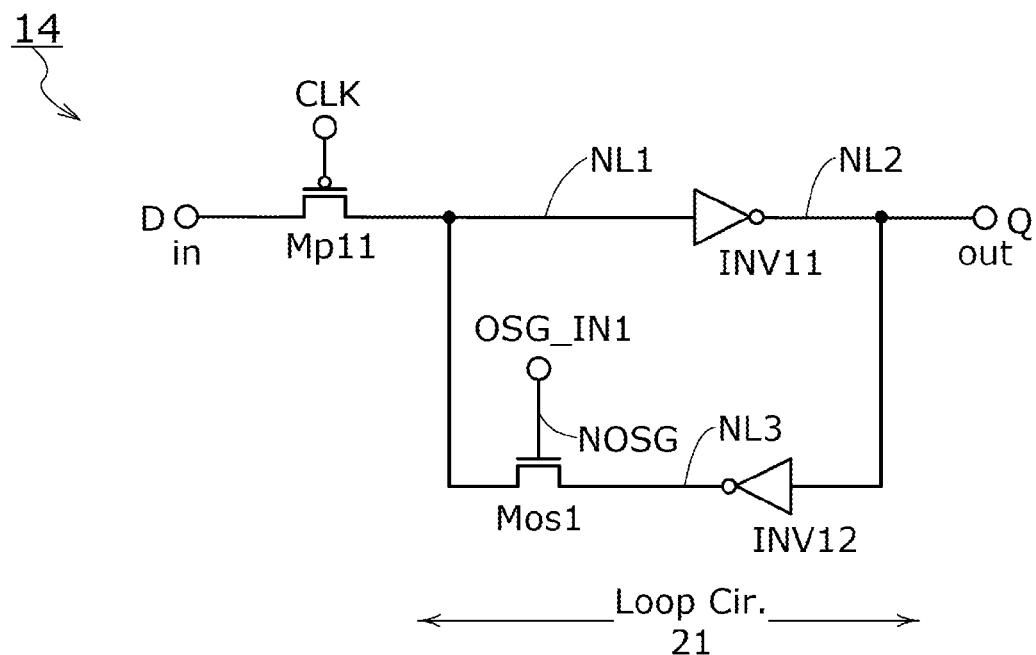
FIG. 8A is a circuit diagram illustrating a circuit structure example.
Figure 8B:
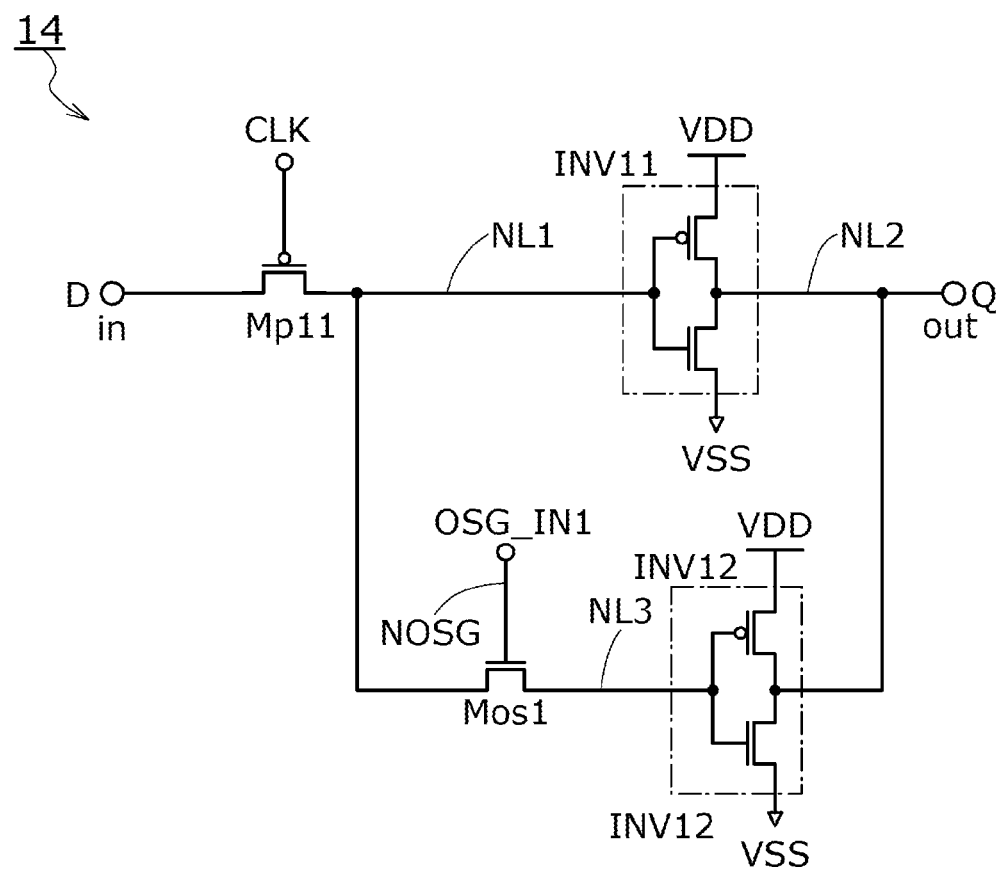
FIG. 8B is an equivalent circuit diagram of FIG. 8A.

FIG. 8A is an example in which a p-channel transistor is used instead of the transistor Mn11. FIG. 8B is an example of an equivalent circuit of FIG. 8A. As illustrated in FIG. 8A, the signal OSG_IN1 (FIG. 3A) may be input to the node NOSG in a circuit 14. Alternatively, the signal OSG_IN2 (FIG. 3B) can be input to the node NOSG instead of the signal OSG_IN1. Also in the circuit 12 (FIG. 4 and FIGS. 5A to 5C), the transistor Mn11 or a transistor Mp11 can be provided instead of TG11.

There is no particular limitation on the device structures of the transistors Mn11 and Mp11. For example, each of the transistors Mn11 and Mp11 can be a transistor whose channel is formed using a semiconductor made of a Group 14 element, such as Si, SiC, or Ge (e.g., a Si transistor), or an OS transistor. For example, in the circuit 13, the transistors Mn11 and Mos1 can be OS transistors and the other transistors can be Si transistors.

Structure Example 4

Figure 9A:
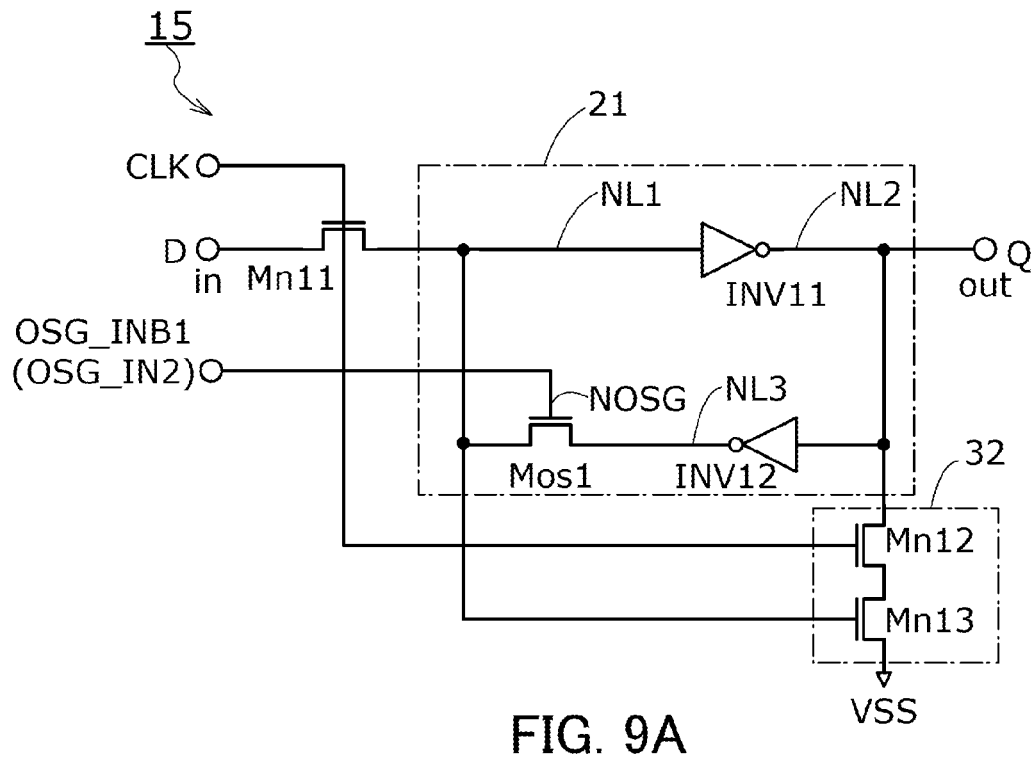
FIGS. 9A and 9B are circuit diagrams each illustrating a circuit structure example.
Figure 9B:
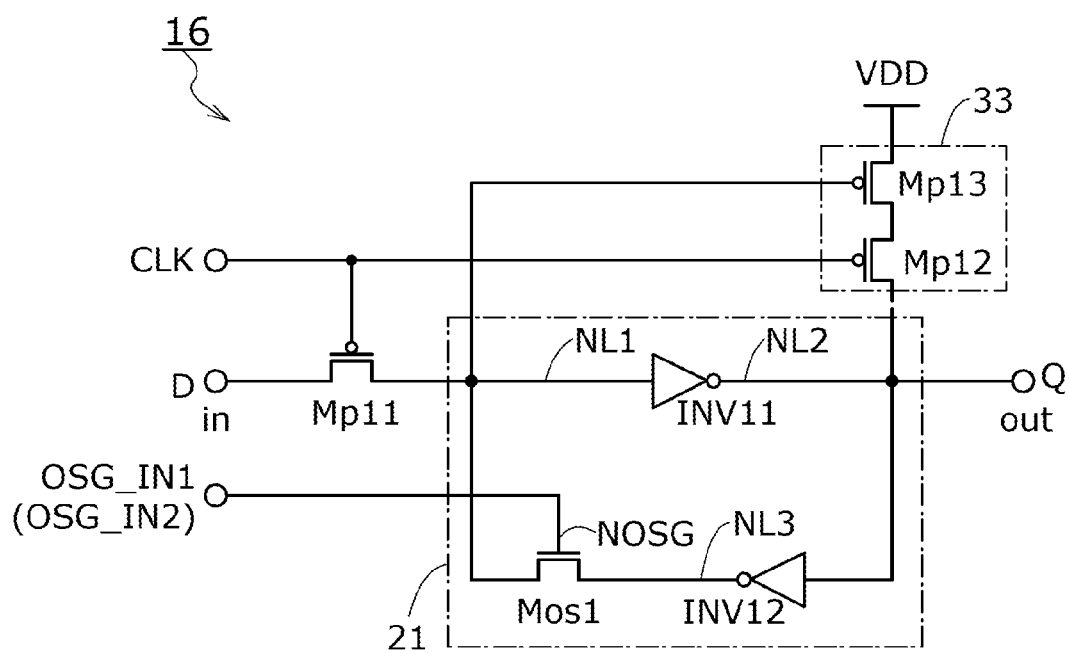

FIGS. 9A and 9B are circuit diagrams each illustrating a circuit structure example. A circuit 15 in FIG. 9A and a circuit 16 in FIG. 9B can each operate as a memory circuit having a function of retaining 1-bit data. The circuit 15 is a modification example of the circuit 13, and the circuit 16 is a modification example of the circuit 14.

In the circuit 13, since the transistor Mn11 is an n-channel transistor, in the case where the high-level data signal D is written to the node NL1, it might be impossible to raise the potential of the node NL1 sufficiently due to the threshold voltage of the transistor Mn11. In other words, a data write error might occur in the circuit 13. Thus, logic circuits (INV11 and INV12) in the loop circuit 21 cannot perform logical operation correctly. As a result, the data signal Q is not determined, and an operational error of a semiconductor device including the circuit 13 occurs.

To prevent such a data write error, in the circuit 15, an output node of a circuit 32 is connected to the node NL2 of the loop circuit 21. The circuit 32 has a function of rewriting the logic (potential level) of the node NL2 into a logic based on the data signal D. The potential of the node NL2 is output from the output terminal out as the data signal Q; thus, in the circuit 15, a data output error is inhibited by correction of the potential of the node NL2 in the circuit 32.

The circuit 32 includes n-channel transistors Mn12 and Mn13 connected in series. The circuit 32 functions as a switch that controls conduction between a wiring to which VSS is supplied and the node NL2. A gate of the transistor Mn12 is connected to a wiring to which the signal CLK is supplied, and the node NL1 (an input node of the loop circuit 21) is connected to a gate of the transistor Mn13. In other words, the signal D is input to the gate of the transistor Mn13 through the transistor Mn11.

In the circuit 32, when the signals CLK and D are each at a high level, the transistors Mn12 and Mn13 are each turned on and the potential of the node NL2 is reset to the low-level potential VSS. In other words, the circuit 32 can set the potential of the node NL2 at a low level reliably when the high-level data signal D is written to the circuit 15.

The circuit 14 including the p-channel transistor Mp11 as the switch SW1 causes a write error of the low-level data signal D easily. To prevent this write error, in the circuit 16, an output node of a circuit 33 is connected to the node NL2 of the loop circuit 21. The circuit 33 includes p-channel transistors Mp12 and Mp13 connected in series. The circuit 33 functions as a switch that controls conduction between a wiring to which VDD is supplied and the node NL2. A gate of the transistor Mp12 is connected to a wiring to which the signal CLK is supplied, and a gate of the transistor Mp13 is connected to the node NL1.

In the circuit 33, when the signals CLK and D are each at a low level, the transistors Mp12 and Mp13 are each turned on and the potential of the node NL2 is reset to the high-level potential VDD. In other words, the circuit 33 can set the potential of the node NL2 at a high level reliably when the low-level data signal D is written.

Note that in FIG. 9A, when the high-level signal D is written, the node NL2 is set at a low level; thus, the low-level potential VSS is supplied to the circuit 32. In the circuit 15, when the high-level signal D is written, the node NL2 is set at a high level in some cases depending on a logic circuit structure in the loop circuit 21. In such a case, the high-level potential VDD may be supplied to the circuit 32 instead of VSS. Also in the circuit 16, VDD may be supplied to the circuit 33 instead of VSS depending on the logic circuit structure in the loop circuit 21.

In addition, in the circuits 15 and 16, the signal OSG_IN2 (FIG. 3B) can be input to the node NOSG. Furthermore, the circuit 32 or 33 can be provided in the circuits 11 to 14.

Structure Example 5

Figure 10:
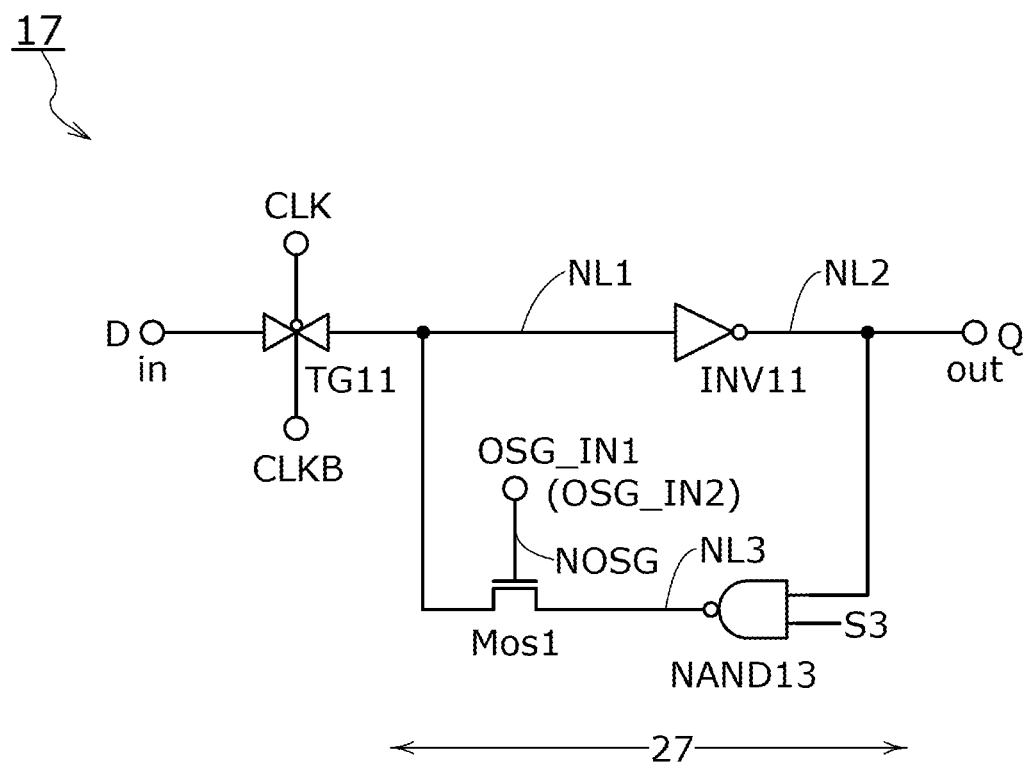
FIG. 10 is a circuit diagram illustrating a circuit structure example.

Although Structure Examples 1 to 4 each describe two inverters provided in a loop circuit, one embodiment of the present invention is not limited thereto. For example, as illustrated in FIG. 10, a NAND gate circuit (NAND13) can be provided in a loop circuit 27. A circuit 17 in FIG. 10 is a modification example of the circuit 11 in which NAND13 is provided instead of INV12. One of two input nodes (terminals) of NAND13 is connected to the node NL2, and the other of the two input nodes of NAND13 is connected to a wiring to which a signal S3 is supplied.

Structure Example of Flip-Flop Circuit

As illustrated in the specific examples in Structure Examples 1 to 5, each of the circuits 101 and 102 can be used as a latch circuit, a 1-bit memory circuit in an SRAM, or the like. In addition, a circuit in which two circuits 101 or two circuits 102 are connected can function as what is called a master-slave flip-flop circuit (MS-FF). An MS-FF with lower power consumption can be provided by using the circuits 101 or 102. Furthermore, an MS-FF with a smaller circuit area can be provided. Some structure examples of a circuit that can be used as a flip-flop circuit are described below. Furthermore, the circuit described below has functions of retaining the data signal D input from the terminal in in accordance with the clock signal CLK and outputting the retained data from the terminal out as the data signal Q in accordance with the clock signal CLK.

Structure Example 1

Figure 11:
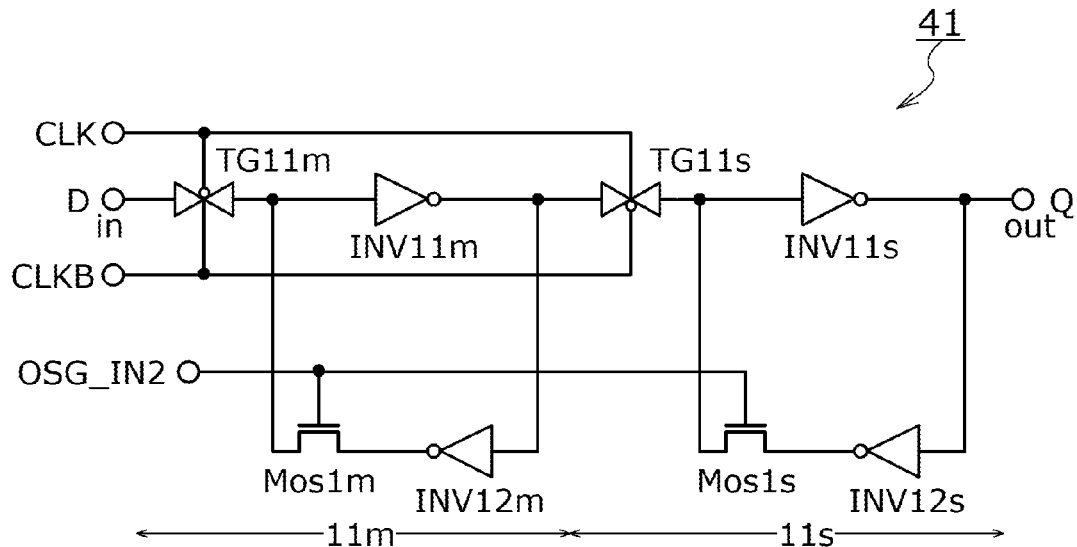
FIG. 11 is a circuit diagram illustrating a circuit structure example.

As illustrated in FIG. 11, a circuit 41 corresponds to a circuit in which two circuits 11 (FIG. 2A) are connected. Here, the circuit 11 in a first stage is referred to as a circuit 11$m$, and the circuit 11 in a second stage is referred to as a circuit 11$s$. In drawings and the like, "m" and "s" are added to the reference numerals of components included in the circuits 11$m$ and 11$s$ to distinguish the components from each other. The same applies to the following structure examples.

In the circuit 41, the circuit 11$m$ in the first stage includes TG11$m$, INV11$m$, INV12$m$, and Mos1$m$. The circuit 11$s$ in the second stage includes TG11$s$, INV11$s$, INV12$s$, and Mos1$s$. In TG11$m$, CLK is input to a gate of a p-channel transistor. In TG11$s$, CLK is input to a gate of an n-channel transistor. In addition, OSG_IN2 is input to gates of the transistors Mos1$m$ and Mos1$s$. Three signals (CLK, CLKB, and OSG_IN2) are input to the circuit 41 as control signals. Note that OSG_IN1 may be input to the gate of the transistor Mos1$m$, and the inverted signal OSG_INB1 of the signal OSG_IN1 may be input to the gate of Mos1$s$.

Structure Example 2

Figure 12:
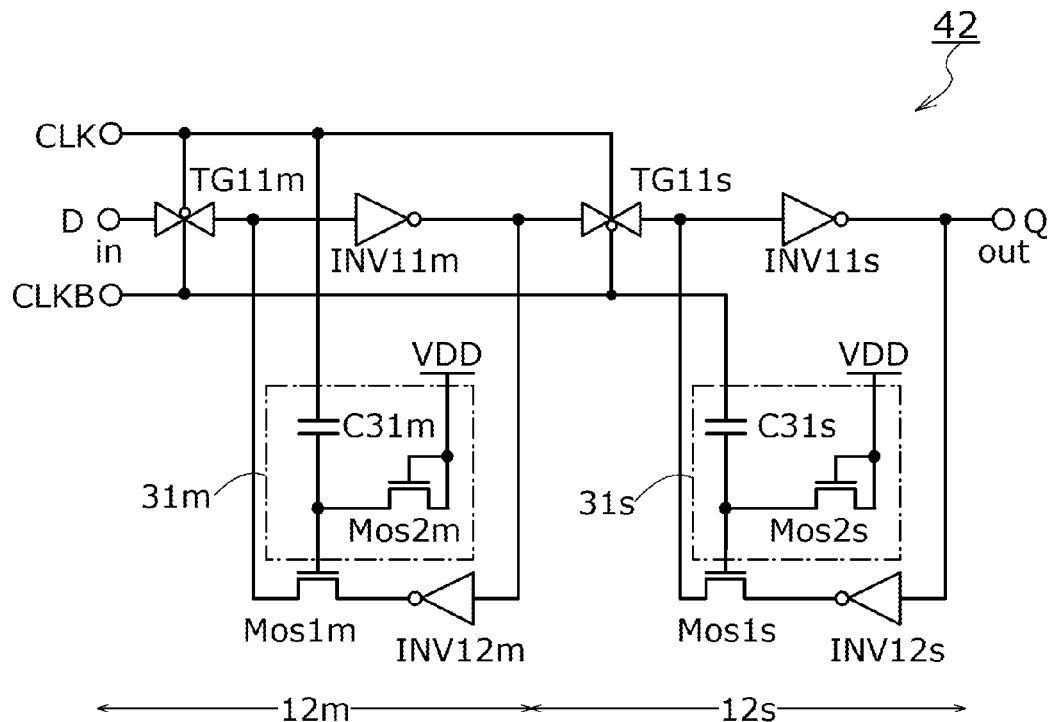
FIG. 12 is a circuit diagram illustrating a circuit structure example.

As illustrated in FIG. 12, a circuit 42 corresponds to a circuit in which circuits 12$m$ and 12$s$ are connected (see FIG. 5A). The circuit 42 is a modification example of the circuit 41. Specifically, a circuit 31$m$ is connected to the gate of the transistor Mos1$m$, and a circuit 31$s$ is connected to the gate of the transistor Mos1$s$. The circuit 31$m$ includes a capacitor C31$m$ and a diode-connected transistor Mos2$m$. The circuit 31$s$ includes a capacitor C31$s$ and a diode-connected transistor Mos2$s$. In FIG. 12, CLK and CLKB are input to the circuits 31$m$ and 31$s$, respectively, as clock signals. Two signals (CLK and CLKB) are input to the circuit 42 as control signals. In other words, the circuit 42 can operate with a small number of control signals as compared with the circuit 41.

As in FIG. 5C, each of the transistors Mos2$m$ and Mos2$s$ can be changed into the diode-connected p-channel transistor Mp31.

Structure Example 3

In the circuit 41 (FIG. 11) and the circuit 42 (FIG. 12), TG11$m$ and TG11$s$ can be n-channel transistors Mn11$m$ and Mn11$s$ (not illustrated). In FIG. 11 and FIG. 12, the signal CLKB may be input to a gate of the transistor Mn11$m$, and the signal CLK may be input to a gate of the transistor Mn11$s$.

Furthermore, TG11$m$ and TG11$s$ can be p-channel transistors Mp11$m$ and Mp11$s$ (not illustrated). In FIG. 11 and FIG. 12, the signal CLK may be input to a gate of the transistor Mp11$m$, and the signal CLKB may be input to a gate of the transistor Mp11$s$.

Structure Example 4

Figure 13:
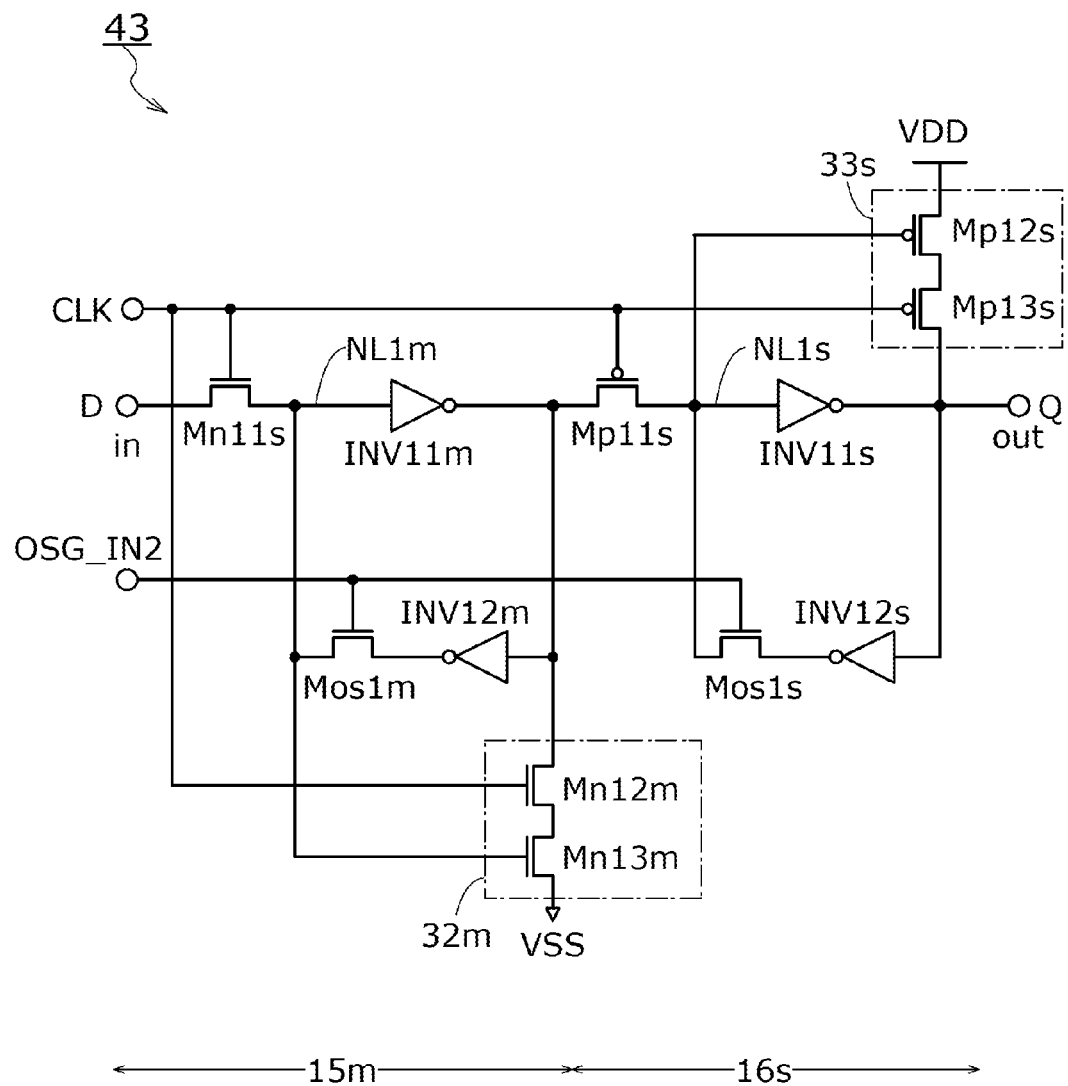
FIG. 13 is a circuit diagram illustrating a circuit structure example.

FIG. 13 is a circuit diagram illustrating a circuit example. A circuit 43 in FIG. 13 is an MS-FF in which a latch circuit in the first stage is a circuit 15$m$ and a latch circuit in the second stage is a circuit 16$s$.

In a circuit 32$m$ of the circuit 15$m$, a gate of a transistor Mn12$m$ is connected to a wiring to which the signal CLK is input, and a transistor Mn13$m$ is connected to a node NL1$m$ (an input node of a loop circuit in the circuit 15$m$). Furthermore, in a circuit 33$s$ of the circuit 16$s$, a transistor Mp12$s$ is connected to a node NL1$s$ of a circuit 15$s$ (an input node of a loop circuit in the circuit 16$s$), and a gate of a transistor Mp13$s$ is connected to a wiring to which the signal CLK is input.

As illustrated in FIG. 13, the circuit 43 can be driven by two control signals (CLK and OSG_IN2). Since driving the circuit 43 does not use CLKB, dynamic power consumption due to flow-through current can be reduced. Furthermore, OSG_IN2 having a constant potential as illustrated in FIG. 3B also leads to a reduction in dynamic power consumption.

Embodiment 2

Figure 14:
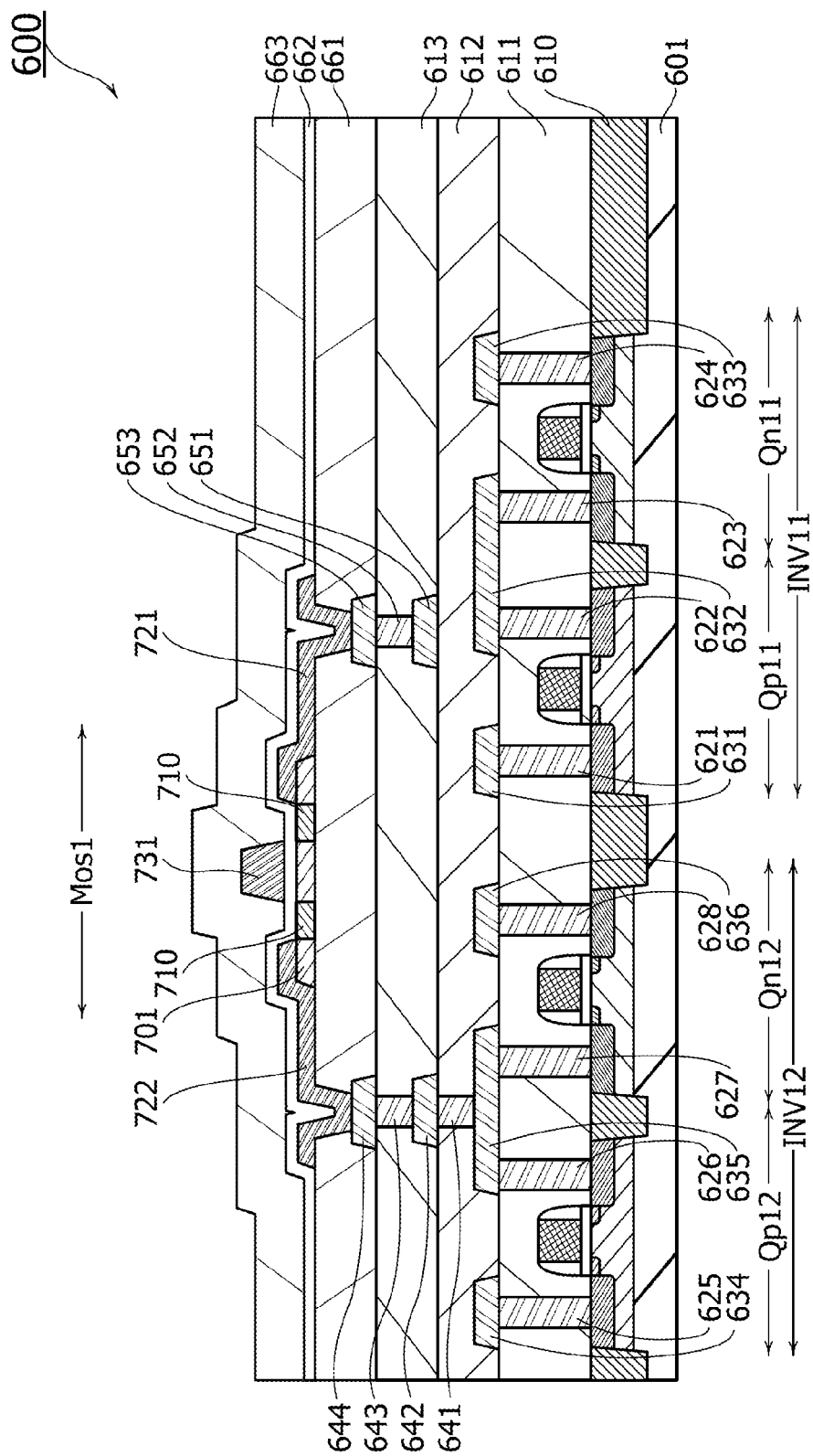
FIG. 14 illustrates a device structure example of a circuit.

In this embodiment, a specific device structure of a semiconductor device including the circuit in Embodiment 1 is described. FIG. 14 is a cross-sectional view illustrating a device structure example of a semiconductor device. A die of an IC chip included in the semiconductor device is illustrated in FIG. 14.

Device Structure

FIG. 14 is not a cross-sectional view of a die 600 taken along a specific section line but a drawing for illustrating a layered structure of the die 600. FIG. 14 typically illustrates cross-sectional structures of some elements included in the circuit 11.

In FIG. 14, the die 600 is formed using a semiconductor substrate. A bulk single-crystal silicon wafer 601 is used as the semiconductor substrate. Note that a substrate for forming a backplane of the die 600 is not limited to the bulk single-crystal silicon wafer but can be any of a variety of semiconductor substrates. For example, an SOI semiconductor substrate including a single-crystal silicon layer may be used.

Transistors Qp11 and Qn1 are Si transistors included in INV11, and transistors Qp12 and Qn12 are Si transistors included in INV12. Qp11 and Qp12 are p-channel transistors, and Qn11 and Qn12 are n-channel transistors. The transistor Mos1 is stacked over INV11 and INV12.

The transistors Qp11, Qn11, Qp12, and Qn12 can be formed using the single-crystal silicon wafer 601 by a known CMOS process. An insulating layer 610 electrically isolates these transistors from each other. An insulating layer 611 is formed to cover the transistors Qp11, Qn11, Qp12, and Qn12. Conductors 631 to 636 are formed over the insulating layer 611. Conductors 621 to 628 are formed in openings provided in the insulating layer 611. As illustrated in FIG. 14, the conductors 621 to 628 and 631 to 636 connect Qp11 to Qn11 to form INV11 and connect Qp12 to Qn12 to form INV12.

One wiring layer or two or more wiring layers are formed over the transistors Qp11, Qn11, Qp12, and Qn12 by a wiring process (BEOL: back end of the line). Here, two wiring layers are formed using insulating layers 612 and 613 and conductors 641 to 644 and 651 to 653.

An insulating layer 661 is formed to cover the wiring layers. The transistor Mos 1 is formed over the insulating layer 661.

The transistor Mos 1 includes an insulating layer 662, an oxide semiconductor (OS) layer 701, and conductors 721, 722, and 731. A channel formation region is formed in the OS layer 701. The conductor 731 constitutes a gate electrode. The conductors 721 and 722 constitute electrodes serving as a source electrode and a drain electrode.

The conductor 721 is connected to the conductor 651 through the conductors 652 and 653. Although not illustrated, the conductor 651 is connected to gates of the transistors Qp11 and Qn11. That is, the conductor 721 is connected to the input node of INV11. The conductor 722 is connected to the conductor 635 through the conductors 641 to 644. In other words, the conductor 722 is connected to the output node of INV12.

An element for lowering resistance (impurity element) may be added to a region 710 that overlaps with neither the conductor 731 (gate) nor the conductors 721 and 722 (source and drain) of the OS layer 701. When an impurity element is added by using the conductors 721, 722, and 731 as masks, the low-resistance region 710 is formed in the OS layer 701 in a self-aligning manner. In other words, the transistor Mos1 can be a top-gate self-aligning transistor.

As an impurity element that is added to the OS layer 701 to lower the resistance, hydrogen (H), boron (B), nitrogen, fluorine, aluminum, phosphorus, a rare gas element (e.g., He, Ne, Ar, Kr, or Xe), or the like can be used. One or more of these elements can be added to the OS layer 701 as impurity elements. For example, argon can be used as an impurity element. Examples of a combination of two kinds of impurity elements include a combination of boron and argon, and a combination of phosphorus and argon. The impurity element can be added by, for example, ion doping, ion implantation, or plasma treatment.

An insulating layer 663 is formed to cover the transistor Mos1. Note that a conductor connected to the transistor Mos1 may be formed over the insulating layer 663 as needed. In that case, an opening for connecting the conductor to the transistor Mos1 is formed in the insulating layer 663.

Each of the insulating layers of the die 600 can be formed using one insulating film or two or more insulating films. Examples of such an insulating film include an aluminum oxide film, a magnesium oxide film, a silicon oxide film, a silicon oxynitride film, a silicon nitride oxide film, a silicon nitride film, a gallium oxide film, a germanium oxide film, an yttrium oxide film, a zirconium oxide film, a lanthanum oxide film, a neodymium oxide film, a hafnium oxide film, and a tantalum oxide film. These insulating films can be formed by sputtering, CVD, MBE, ALD, or PLD.

In this specification, an oxynitride refers to a substance that includes more oxygen than nitrogen, and a nitride oxide refers to a substance that includes more nitrogen than oxygen.

Each of the conductors of the die 600 can be formed using one conductive film or two or more conductive films. Such a conductive film can be a metal film containing aluminum, chromium, copper, silver, gold, platinum, tantalum, nickel, titanium, molybdenum, tungsten, hafnium, vanadium, niobium, manganese, magnesium, zirconium, beryllium, or the like. Such a conductive film can be an alloy film containing any of these metals as a component, a compound film containing any of these metals as a component, or a polycrystalline silicon film containing an impurity element such as phosphorus, or the like.

The insulating layers, conductors, semiconductors, and oxide semiconductors included in the die 600 are preferably formed by sputtering; chemical vapor deposition (CVD) such as metal organic chemical vapor deposition (MOCVD), atomic layer deposition (ALD), or plasma-enhanced CVD (PECVD); vacuum vapor deposition; or pulse laser deposition (PLD). To reduce damage by plasma, MOCVD or ALD is preferably used.

Structure Example of Transistor

The device structures of the Si transistor and the OS transistor included in the die 600 are not limited to those in FIG. 14. For example, the OS transistor may include a back gate. In the transistor Mos1 of FIG. 13, as in the conductors 644 and 653, a conductor that functions as a back gate may be formed over the insulating layer 613 to overlap with the OS layer 701. The conductor may be connected to the conductor 731. In that case, the transistor Mos1 has a device structure in which the back gate is connected to the gate.

Structure Example of OS Transistor

FIGS. 15A to 15D illustrate a structure example of an OS transistor. FIG. 15A is a top view illustrating a structure example of an OS transistor. FIG. 15B is a cross-sectional view taken along line Y1-Y2 in FIG. 15A. FIG. 15C is a cross-sectional view taken along line X1-X2 in FIG. 15A. FIG. 15D is a cross-sectional view taken along line X3-X4 in FIG. 15A. In some cases, the direction of line Y1-Y2 is referred to as a channel length direction, and the direction of line X1-X2 is referred to as a channel width direction. Accordingly, FIG. 15B illustrates a cross-sectional structure of the OS transistor in the channel length direction, and FIGS. 15C and 15D each illustrate a cross-sectional structure of the OS transistor in the channel width direction. Note that to clarify the device structure, FIG. 15A does not illustrate some components.

Note that channel length refers to, for example, a distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

Channel width refers to, for example, the length of a portion where a source and a drain face each other in a region where a semiconductor (or a portion where current flows in a semiconductor when a transistor is on) and a gate electrode overlap with each other, or a region where a channel is formed. In one transistor, channel widths in all regions do not necessarily have the same value. In other words, the channel width of one transistor is not fixed to one value in some cases. Thus, in this specification, the channel width is any one of values, the maximum value, the minimum value, or the average value in a region where a channel is formed.

Note that depending on transistor structures, channel width in a region where a channel is formed actually (hereinafter referred to as effective channel width) is different from channel width shown in a top view of a transistor (hereinafter referred to as apparent channel width) in some cases. For example, in a transistor having a three-dimensional structure, effective channel width is greater than apparent channel width shown in a top view of the transistor, and its influence cannot be ignored in some cases. For example, in a scaled down transistor having a three-dimensional structure, the proportion of a channel region formed in a side surface of a semiconductor is higher than the proportion of a channel region formed in a top surface of the semiconductor in some cases. In that case, effective channel width obtained when a channel is actually formed is greater than apparent channel width shown in the top view.

In a transistor having a three-dimensional structure, measuring effective channel width is difficult in some cases. For example, estimation of effective channel width from a design value requires an assumption that the shape of a semiconductor is known. Thus, in the case where the shape of a semiconductor is not known accurately, measuring effective channel width accurately is difficult.

Therefore, in this specification, in a top view of a transistor, apparent channel width that is the length of a portion where a source and a drain face each other in a region where a semiconductor and a gate electrode overlap with each other is referred to as surrounded channel width (SCW) in some cases. Furthermore, in this specification, in the case where the term "channel width" is simply used, it may denote surrounded channel width or apparent channel width. Alternatively, in this specification, in the case where the term "channel width" is simply used, it may denote effective channel width. Note that the values of channel length, channel width, effective channel width, apparent channel width, surrounded channel width, and the like can be determined by obtaining and analyzing a cross-sectional TEM image and the like.

Note that in the case where field-effect mobility, a current value per channel width, and the like of a transistor are obtained by calculation, surrounded channel width may be used for the calculation. In that case, the values may be different from those calculated using effective channel width in some cases.

An OS transistor 800 is formed over an insulating layer 812 over a semiconductor substrate 801. The insulating layer 812 corresponds to the insulating layer 661 in FIG. 14. The OS transistor 800 includes oxide semiconductor films (OS films) 821 to 823 and conductors 841 to 843. A stack of the OS films 821 to 823 is referred to as an oxide semiconductor layer (OS layer) 820.

The conductors 841 and 842 form terminals that can function as a source electrode and a drain electrode. The conductors 841 and 842 are each formed in contact with the stack in which the OS films 821 and 822 are formed sequentially. The third layer of the OS layer 820 (i.e., the OS film 823) is formed over the OS film 822 with the conductors 841 and 842 positioned therebetween. An insulating layer 813 is formed to cover the OS layer 820 and the conductors 841 and 842. The insulating layer 813 serves as a gate insulating layer of the OS transistor 800. The conductor 843 is formed over the insulating layer 813. The conductor 843 serves as a gate electrode of the OS transistor 800.

Insulating layers 814 and 815 are formed to cover the OS transistor 800. Conductors 851 to 853 are formed over the insulating layer 815. The conductor 851 is in contact with the conductor 841 through an opening 861. The conductor 852 is in contact with the conductor 842 through an opening 862. The conductor 853 is in contact with the conductor 843 through an opening 863.

The OS transistor 800 is a top-gate transistor. The channel length of the OS transistor 800 is greater than or equal to 10 nm and less than or equal to 1000 nm, preferably greater than or equal to 20 nm and less than or equal to 500 nm, more preferably greater than or equal to 30 nm and less than or equal to 300 nm.

The bandgap of each of the OS films 821 and 823 is preferably wider than that of the OS film 822. Thus, electrons transfer mainly through the OS film 822 in the layered structure having the energy band structure of the OS layer 820. Therefore, even when an interface state exists at an interface between the OS film 821 and the insulating layer 812 or an interface between the OS film 823 and the insulating layer 813, the interface state hardly influences electron transfer in the OS layer 820. In addition, since no interface state or few interface states exist at an interface between the OS films 821 and 822 and an interface between the OS films 822 and 823, electron transfer in the region is not interrupted. Accordingly, high field-effect mobility can be obtained in the OS transistor 800 having the layered structure of the OS films.

For the OS films 821 and 823, for example, a material containing Al, Ti, Ga, Ge, Y, Zr, Sn, La, Ce, or Hf with a higher atomic ratio than that used for the OS film 822 can be used. Specifically, the atomic ratio of any of the above metal elements in the OS films 821 and 823 is 1.5 times or more, preferably 2 times or more, more preferably 3 times or more that in the OS film 822. Any of the above metal elements is strongly bonded to oxygen and thus has a function of inhibiting generation of oxygen vacancies in the oxide semiconductor. That is, oxygen vacancies are less likely to be generated in the OS films 821 and 823 than in the OS film 822.

Note that when each of the OS films 821 to 823 is an In-M-Zn oxide containing at least indium, zinc, and M (M is a metal such as Al, Ti, Ga, Ge, Y, Zr, Sn, La, Ce, or Hf), in the case where the OS film 821 has an atomic ratio of In to M and Zn which is $x_1:y_1:z_1$, the OS film 822 has an atomic ratio of In to M and Zn which is $x_2:y_2:z_2$, and the OS film 823 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, more preferably 3 times or more as large as $y_2/x_2$. At this time, when $y_2$ is greater than or equal to $x_2$ in the OS film 822, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in the OS films 821 and 823 are preferably less than 50 atomic % and greater than or equal to 50 atomic %, respectively, more preferably less than 25 atomic % and greater than or equal to 75 atomic %, respectively. Furthermore, in the case where Zn and O are not taken into consideration, the proportion of In and the proportion of M in the OS film 822 are preferably greater than 25 atomic % and less than 75 atomic %, respectively, more preferably greater than 34 atomic % and less than 66 atomic %, respectively.

The thickness of each of the OS films 821 and 823 is greater than or equal to 3 nm and less than or equal to 100 nm, preferably greater than or equal to 3 nm and less than or equal to 50 nm. The thickness of the OS film 822 is greater than or equal to 3 nm and less than or equal to 200 nm, preferably greater than or equal to 3 nm and less than or equal to 100 nm, more preferably greater than or equal to 3 nm and less than or equal to 50 nm. The thickness of the OS film 822 is preferably larger than that of each of the OS films 821 and 823.

Oxide Semiconductor Film

Next, an oxide semiconductor film used for an OS transistor is described.

A channel formation region of an OS transistor is preferably formed using a highly purified oxide semiconductor (purified OS). A purified OS refers to an oxide semiconductor obtained by reduction of impurities such as moisture or hydrogen that serve as electron donors (donors) and reduction of oxygen vacancies. By highly purifying an oxide semiconductor in this manner, the conductivity type of the oxide semiconductor can be intrinsic or substantially intrinsic. The term "substantially intrinsic" means that the carrier density of an oxide semiconductor is lower than $1\times10^{17}/cm^3$. The carrier density is preferably lower than $1\times10^{15}/cm^3$, more preferably lower than $1\times10^{13}/cm^3$.

By forming the channel formation region using a purified OS, the normalized off-state current of the OS transistor can be as low as several yoctoamperes per micrometer to several zeptoamperes per micrometer at room temperature.

In the oxide semiconductor, hydrogen, nitrogen, carbon, silicon, and metal elements that are not main components are impurities. For example, hydrogen and nitrogen form donor levels to increase the carrier density. Silicon forms impurity levels in the oxide semiconductor. The impurity level becomes a trap, which might degrade the electrical characteristics of the OS transistor. It is preferable to reduce the concentration of the impurities in the oxide semiconductor and at an interface with another layer.

To make the oxide semiconductor intrinsic or substantially intrinsic, the oxide semiconductor is preferably highly purified to approximately any of the following impurity concentration levels. The following impurity concentrations are obtained by secondary ion mass spectrometry (SIMS) analysis at a certain depth of an oxide semiconductor layer or in a certain region of the oxide semiconductor layer. The purified OS has any of the following impurity concentration levels.

For example, in the case where the impurity includes silicon, the concentration of silicon is lower than $1\times10^{19}$ atoms/$cm^3$, preferably lower than $5\times10^{18}$ atoms/$cm^3$, more preferably lower than $1\times10^{18}$ atoms/$cm^3$.

For example, in the case where the impurity includes hydrogen, the concentration of hydrogen is lower than or equal to $2\times10^{20}$ atoms/$cm^3$, preferably lower than or equal to $5\times10^{19}$ atoms/$cm^3$, more preferably lower than or equal to $1\times10^{19}$ atoms/$cm^3$, still more preferably lower than or equal to $5\times10^{18}$ atoms/$cm^3$.

For example, in the case where the impurity includes nitrogen, the concentration of nitrogen is lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, still more preferably lower than or equal to $5\times10^{17}$ atoms/$cm^3$.

In the case where the oxide semiconductor including crystals contains silicon or carbon at high concentration, the crystallinity of the oxide semiconductor might be lowered. In order not to lower the crystallinity of the oxide semiconductor, for example, the concentration of silicon is set lower than $1\times10^{19}$ atoms/$cm^3$, preferably lower than $5\times10^{18}$ atoms/$cm^3$, more preferably lower than $1\times10^{18}$ atoms/$cm^3$. For example, the concentration of carbon is set lower than $1\times10^{19}$ atoms/$cm^3$, preferably lower than $5\times10^{18}$ atoms/$cm^3$, more preferably lower than $1\times10^{18}$ atoms/$cm^3$.

As the oxide semiconductor used for the OS transistor, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide (also referred to as IGZO), an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn—based oxide means an oxide containing In, Ga, and Zn, and there is no limitation on the ratio of In, Ga, and Zn. The In—Ga—Zn—based oxide may contain a metal element other than In, Ga, and Zn. An oxide semiconductor having an appropriate composition may be formed in accordance with needed electrical characteristics (e.g., field-effect mobility and threshold voltage).

For example, an In—Ga—Zn oxide with an atomic ratio of In:Ga:Zn=1:1:1, In:Ga:Zn=1:3:2, In:Ga:Zn=3:1:2, or In:Ga:Zn=2:1:3, or an oxide whose composition is in the neighborhood of the above composition is preferably used. In this specification, the atomic ratio of the oxide semiconductor varies within a range of ±20% as an error.

For example, in the case where an In—Ga—Zn oxide is deposited by sputtering, it is preferable to use an In—Ga—Zn oxide target with an atomic ratio of In:Ga:Zn=1:1:1, 5:5:6, 4:2:3, 3:1:2, 1:1:2, 2:1:3, 1:3:2, 1:3:4, 1:4:4, 1:6:4, or 3:1:4 as an In—Ga—Zn oxide deposition target. When an In—Ga—Zn oxide semiconductor film is deposited using such a target, a crystal part is formed in the oxide semiconductor film easily. The filling factor of such a target is preferably higher than or equal to 90%, more preferably higher than or equal to 95%. With a target having a high filling factor, a dense oxide semiconductor film can be deposited.

For example, an In—Zn oxide target is used as an In—Zn oxide deposition target. The atomic ratio of In:Zn in this target is preferably 50:1 to 1:2, more preferably 15:1 to 1.5:1. When the atomic ratio is converted into a molar ratio, the molar ratio of $In_2O_3$:ZnO is preferably 25:1 to 1:4, more preferably 15:2 to 3:4. For example, in an In—Zn oxide deposition target with an atomic ratio of In:Zn:O=X:Y:Z, the relation Z>1.5X+Y is preferably satisfied. The mobility of an In—Zn oxide film can be increased by keeping the ratio of Zn within the above range.

Structure of Oxide Semiconductor Film

The structure of the OS layer of the OS transistor is described below. The OS layer of the OS transistor can be formed using one oxide semiconductor film or a stacked layer of two or more oxide semiconductor films. As the oxide semiconductor film of the OS layer, a single-crystal oxide semiconductor film or a non-single-crystal oxide semiconductor film is used. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films having a plurality of crystal parts. The CAAC-OS film is described below.

CAAC-OS Film

The CAAC-OS film is one of oxide semiconductor films having a plurality of c-axis aligned crystal parts. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film. Furthermore, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts. From the results of the cross-sectional TEM image and the planar TEM image, alignment is found in the crystal parts in the CAAC-OS film.

In an electron diffraction pattern of the CAAC-OS film, spots (bright spots) indicating alignment are observed. For example, when electron diffraction with an electron beam having a diameter of 1 to 30 nm (such electron diffraction is also referred to as nanobeam electron diffraction) is performed on the top surface of the CAAC-OS film, spots are observed.

Most of the crystal parts included in the CAAC-OS film each fit into a cube whose one side is less than 100 nm. Thus, there is a case where a crystal part included in the CAAC-OS film fits into a cube whose one side is less than 10 nm, less than 5 nm, or less than 3 nm. Note that when a plurality of crystal parts included in the CAAC-OS film are connected, one large crystal region is formed in some cases. For example, a crystal region with an area of larger than or equal to 2500 $nm^2$, larger than or equal to 5 $\mu m^2$, or larger than or equal to 1000 $\mu m^2$ is observed in some cases in the planar TEM image.

The CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (Φ scan) is performed under conditions where the sample is rotated around a normal vector of a sample surface as an axis (Φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when Φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

The crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

In addition, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Furthermore, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Microcrystalline Oxide Semiconductor Film

Next, a microcrystalline oxide semiconductor film is described. In a TEM image, crystal parts cannot be found clearly in the microcrystalline oxide semiconductor film in some cases. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a TEM image, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

Embodiment 3

In this embodiment, a semiconductor device that includes a circuit capable of storing data is described.

The circuit in Embodiment 1 can function as a storage circuit or a sequential circuit and, for example, can be used in a variety of semiconductor devices as a storage circuit that stores output data of a combinational circuit. For example, the circuit in Embodiment 1 can be used for a register in a central processing unit (CPU), a microcontroller unit (MCU), a programmable logic device (typically, FPGA), or the like.

As described above, the dynamic power consumption of the circuit in Embodiment 1 is reduced, so that the power consumption of a processor including the circuit can also be reduced. The processor including the circuit in Embodiment 1 can be used as processors of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy.

Examples of such electronic devices are display devices, personal computers, and image reproducing devices provided with recording media (devices that read image data of recording media such as digital versatile discs (DVDs) and have display portions for displaying images). Other examples are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 16A to 16F illustrate specific examples of these electronic devices.

Figure 16A:
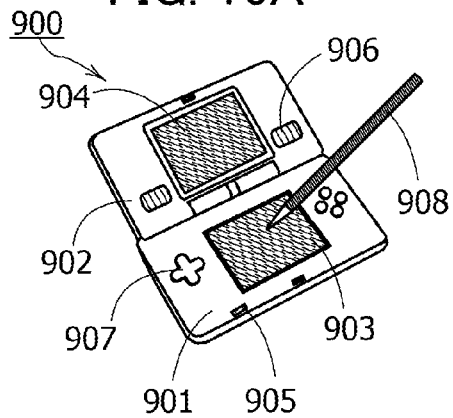
FIGS. 16A to 16F each illustrate an electronic device.

FIG. 16A is an external view illustrating a structure example of a portable game machine. A portable game machine 900 includes a housing 901, a housing 902, a display portion 903, a display portion 904, a microphone 905, a speaker 906, an operation key 907, a stylus 908, and the like.

Figure 16B:
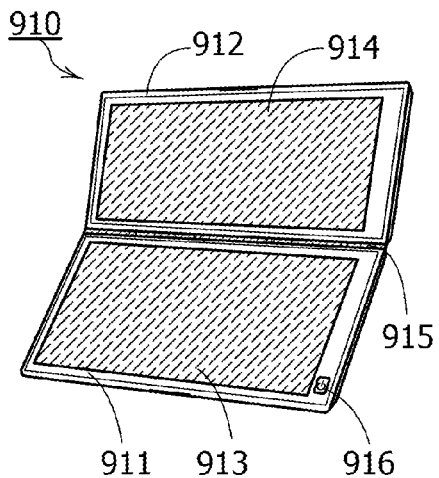

FIG. 16B is an external view illustrating a structure example of a portable information terminal The portable information terminal 910 includes a housing 911, a housing 912, a display portion 913, a display portion 914, a joint 915, an operation key 916, and the like. The display portion 913 is provided in the housing 911, and the display portion 914 is provided in the housing 912. The housings 911 and 912 are connected to each other with the joint 915, and an angle between the housings 911 and 912 can be changed with the joint 915. An image on the display portion 913 may be switched depending on the angle between the housings 911 and 912 at the joint 915. A display device with a touch panel may be used as the display portion 913 and/or the display portion 914.

Figure 16C:
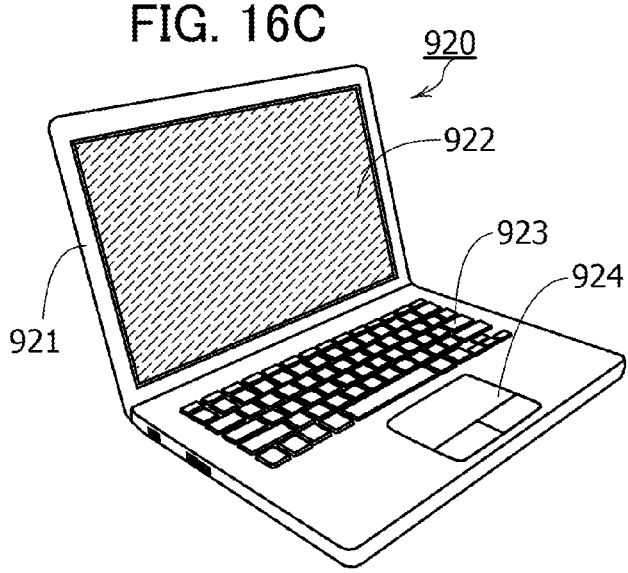

FIG. 16C is an external view illustrating a structure example of a laptop. A personal computer 920 includes a housing 921, a display portion 922, a keyboard 923, a pointing device 924, and the like.

Figure 16D:
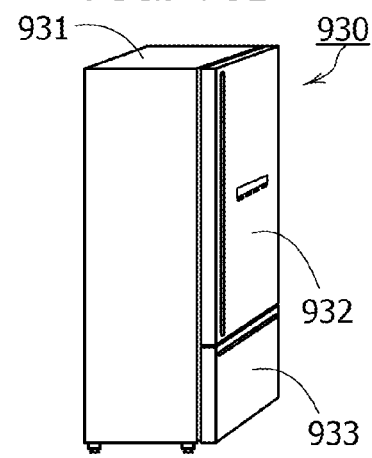

FIG. 16D is an external view illustrating a structure example of an electric refrigerator-freezer. An electric refrigerator-freezer 930 includes a housing 931, a refrigerator door 932, a freezer door 933, and the like.

Figure 16E:
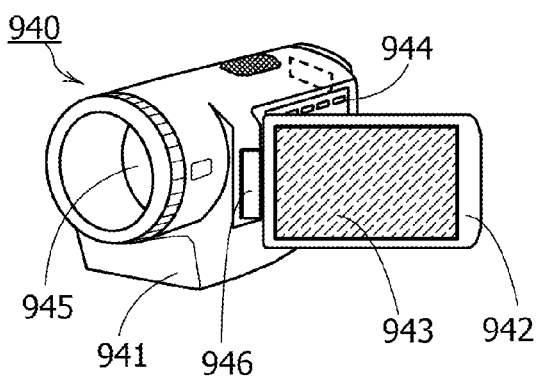

FIG. 16E is an external view illustrating a structure example of a video camera. A video camera 940 includes a housing 941, a housing 942, a display portion 943, operation keys 944, a lens 945, a joint 946, and the like. The operation keys 944 and the lens 945 are provided in the housing 941, and the display portion 943 is provided in the housing 942. The housings 941 and 942 are connected to each other with the joint 946, and an angle between the housings 941 and 942 can be changed with the joint 946. The direction of an image on the display portion 943 may be changed and display and non-display of an image may be switched depending on the angle between the housings 941 and 942.

Figure 16F:
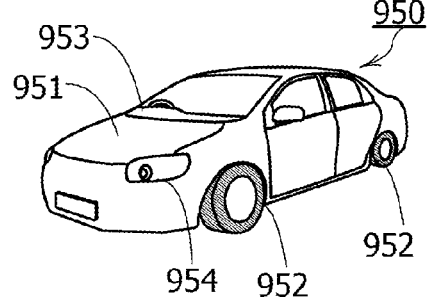

FIG. 16F is an external view illustrating a structure example of a motor vehicle. A motor vehicle 950 includes a car body 951, wheels 952, a dashboard 953, lights 954, and the like.

This application is based on Japanese Patent Application serial No. 2014-003017 filed with Japan Patent Office on Jan. 10, 2014, the entire contents of which are hereby incorporated by reference.

What is claimed is:

1. A semiconductor device comprising:
   a circuit comprising:
      a switch;
      a first logic circuit;
      a second logic circuit; and
      a first transistor comprising an oxide semiconductor layer comprising a channel formation region,
   wherein a first terminal of the switch is electrically connected to an input terminal of the circuit and a second terminal of the switch is electrically connected to an input node of the first logic circuit,
   wherein an output node of the first logic circuit is electrically connected to an output terminal of the circuit and an input node of the second logic circuit,
   wherein an output node of the second logic circuit is electrically connected to one of a source and a drain of the first transistor,
   wherein the other of the source and the drain of the first transistor is electrically connected to the input terminal of the first logic circuit,
   wherein a first clock signal is supplied to the switch,
   wherein a second clock signal is supplied to a gate of the first transistor,
   wherein the first clock signal comprises a first potential and a second potential lower than the first potential,
   wherein the second clock signal comprises a third potential and a fourth potential lower than the third potential,
   wherein the third potential is higher than the first potential, and
   wherein the fourth potential is higher than the second potential.

2. The semiconductor device according to claim 1, wherein the switch is a transistor comprising an oxide semiconductor layer comprising a channel formation region.

3. The semiconductor device according to claim 1, further comprising:
   a second transistor; and
   a capacitor,
   wherein a gate of the first transistor is electrically connected to one of a source and a drain of the second transistor and a terminal of the capacitor, and
   wherein the second transistor is a diode-connected transistor.

4. The semiconductor device according to claim 1,
   a second transistor; and
   a third transistor,
   wherein one of a source and a drain of the second transistor is electrically connected to the output node of the first logic circuit,
   wherein the other of the source and the drain of the second transistor is electrically connected to one of a source and a drain of the third transistor,
   wherein a gate of the second transistor is electrically connected to the switch, and
   wherein a gate of the third transistor is electrically connected to the input node of the first logic circuit.

5. The semiconductor device according to claim 1, wherein a constant potential is supplied to a gate of the first transistor during a period when a clock signal is supplied to the switch.

6. The semiconductor device according to claim 1, wherein the first logic circuit and the second logic circuit each include one of an AND gate circuit, an OR gate circuit, an inverter, a NAND gate circuit, a NOR gate circuit, an XOR gate circuit, an XNOR gate circuit, and a buffer circuit.

7. The semiconductor device according to claim 1, wherein the circuit is a latch circuit.

8. A semiconductor device comprising a combinational circuit, wherein the semiconductor device according to claim 1 is a storage circuit configured to retain output data of the combinational circuit.

9. A semiconductor device comprising:
   a circuit comprising:
      a switch;
      a first logic circuit;
      a second logic circuit;
      a first transistor comprising an oxide semiconductor layer comprising a channel formation region,
      a second transistor; and
      a capacitor
   wherein a first terminal of the switch is electrically connected to an input terminal of the circuit and a second terminal of the switch is electrically connected to an input node of the first logic circuit,
   wherein an output node of the first logic circuit is electrically connected to an output terminal of the circuit and an input node of the second logic circuit,
   wherein an output node of the second logic circuit is electrically connected to one of a source and a drain of the first transistor,
   wherein the other of the source and the drain of the first transistor is electrically connected to the input terminal of the first logic circuit,
   wherein a gate of the first transistor is electrically connected to one of a source and a drain of the second transistor and a terminal of the capacitor, and
   wherein the second transistor is a diode-connected transistor.

10. The semiconductor device according to claim 9,
    wherein a first clock signal is supplied to the switch,
    wherein a second clock signal is supplied to a gate of the first transistor,
    wherein the first clock signal comprises a first potential and a second potential lower than the first potential,
    wherein the second clock signal comprises a third potential and a fourth potential lower than the third potential,
    wherein the third potential is higher than the first potential, and
    wherein the fourth potential is higher than the second potential.

11. The semiconductor device according to claim 9,
    a second transistor; and
    a third transistor,
    wherein one of a source and a drain of the second transistor is electrically connected to the output node of the first logic circuit,
    wherein the other of the source and the drain of the second transistor is electrically connected to one of a source and a drain of the third transistor,
    wherein a gate of the second transistor is electrically connected to the switch, and wherein a gate of the third transistor is electrically connected to the input node of the first logic circuit.

12. The semiconductor device according to claim 9, wherein a constant potential is supplied to a gate of the first transistor during a period when a clock signal is supplied to the switch.

13. The semiconductor device according to claim 9, wherein the first logic circuit and the second logic circuit each include one of an AND gate circuit, an OR gate circuit, an inverter, a NAND gate circuit, a NOR gate circuit, an XOR gate circuit, an XNOR gate circuit, and a buffer circuit.

14. The semiconductor device according to claim 9, wherein the circuit is a latch circuit.

15. A semiconductor device comprising a combinational circuit, wherein the semiconductor device according to claim 9 is a storage circuit configured to retain output data of the combinational circuit.

16. The semiconductor device according to claim 9, wherein the switch is a transistor comprising an oxide semiconductor layer comprising a channel formation region.

17. A semiconductor device comprising:
a circuit comprising:
a switch;
a first logic circuit;
a second logic circuit;
a first transistor comprising an oxide semiconductor layer comprising a channel formation region;
a second transistor; and
a third transistor,
wherein a first terminal of the switch is electrically connected to an input terminal of the circuit and a second terminal of the switch is electrically connected to an input node of the first logic circuit,
wherein an output node of the first logic circuit is electrically connected to an output terminal of the circuit and an input node of the second logic circuit,
wherein an output node of the second logic circuit is electrically connected to one of a source and a drain of the first transistor, and
wherein the other of the source and the drain of the first transistor is electrically connected to the input terminal of the first logic circuit,
wherein one of a source and a drain of the second transistor is electrically connected to the output node of the first logic circuit,
wherein the other of the source and the drain of the second transistor is electrically connected to one of a source and a drain of the third transistor,
wherein a gate of the second transistor is electrically connected to the switch, and
wherein a gate of the third transistor is electrically connected to the input node of the first logic circuit.

18. The semiconductor device according to claim 17, wherein a first clock signal is supplied to the switch, wherein a second clock signal is supplied to a gate of the first transistor,
wherein the first clock signal comprises a first potential and a second potential lower than the first potential,
wherein the second clock signal comprises a third potential and a fourth potential lower than the third potential,
wherein the third potential is higher than the first potential, and
wherein the fourth potential is higher than the second potential.

19. The semiconductor device according to claim 17, wherein the switch is a transistor comprising an oxide semiconductor layer comprising a channel formation region.

20. The semiconductor device according to claim 17, further comprising:
a second transistor; and
a capacitor,
wherein a gate of the first transistor is electrically connected to one of a source and a drain of the second transistor and a terminal of the capacitor, and
wherein the second transistor is a diode-connected transistor.

21. The semiconductor device according to claim 17, wherein a constant potential is supplied to a gate of the first transistor during a period when a clock signal is supplied to the switch.

22. The semiconductor device according to claim 17, wherein the first logic circuit and the second logic circuit each include one of an AND gate circuit, an OR gate circuit, an inverter, a NAND gate circuit, a NOR gate circuit, an XOR gate circuit, an XNOR gate circuit, and a buffer circuit.

23. The semiconductor device according to claim 17, wherein the circuit is a latch circuit.

24. A semiconductor device comprising a combinational circuit, wherein the semiconductor device according to claim 17 is a storage circuit configured to retain output data of the combinational circuit.

* * * * *